(12) United States Patent
Kobayashi

(10) Patent No.: US 7,911,866 B2
(45) Date of Patent: Mar. 22, 2011

(54) SEMICONDUCTOR MEMORY FOR AUTOMATIC EXECUTING REFRESH OPERATIONS

(75) Inventor: Hiroyuki Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 40 days.

(21) Appl. No.: 11/471,474

(22) Filed: Jun. 21, 2006

(65) Prior Publication Data
US 2007/0211549 A1    Sep. 13, 2007

(30) Foreign Application Priority Data

Mar. 9, 2006   (JP) ................... 2006-064221

(51) Int. Cl.
*G11C 7/00*   (2006.01)
(52) U.S. Cl. ............... 365/222; 365/230.03; 365/189.04
(58) Field of Classification Search .................. 365/222, 365/230.03, 189.04
See application file for complete search history.

(56) References Cited

U.S. PATENT DOCUMENTS

| | | | |
|---|---|---|---|
| 5,511,033 A | | 4/1996 | Jung |
| 6,285,578 B1 * | | 9/2001 | Huang ................. 365/154 |
| 6,426,909 B1 * | | 7/2002 | Tomita ................. 365/222 |
| 6,560,153 B2 * | | 5/2003 | Mizugaki .............. 365/222 |
| 6,646,944 B2 * | | 11/2003 | Shimano et al. ........ 365/222 |
| 6,728,157 B2 * | | 4/2004 | Yagishita et al. ...... 365/222 |
| 6,967,885 B2 | | 11/2005 | Barth, Jr. et al. |
| 2001/0043499 A1 | | 11/2001 | Komura et al. |
| 2001/0048616 A1 | | 12/2001 | Ayukawa et al. |
| 2002/0016032 A1 | | 2/2002 | Mizugaki |
| 2003/0007407 A1 | | 1/2003 | Miyamoto et al. |

FOREIGN PATENT DOCUMENTS

| | | |
|---|---|---|
| JP | 7-226077 | 8/1995 |
| JP | 10-134569 | 5/1998 |
| JP | 2002-0096926 | 12/2002 |
| JP | 2005-203092 | 7/2005 |

* cited by examiner

*Primary Examiner* — Hoai V Ho
*Assistant Examiner* — Kretelia Graham
(74) *Attorney, Agent, or Firm* — Arent Fox LLP

(57) ABSTRACT

A semiconductor memory executes an access operation on one of a plurality of memory blocks in response to an externally supplied access request. At this time, in response to the access request, a memory control unit executes the access operation on one of the memory blocks and a refresh operation on at least one of the memory blocks on which the access operation is not executed. Consequently, it is possible to execute the refresh operation during the execution of the access operation without any conflict between the access operation and the refresh operation. As a result, the access cycle time can be shortened, which can improve the data transfer rate.

19 Claims, 15 Drawing Sheets

SEMICONDUCTOR MEMORY FOR AUTOMATIC EXECUTING REFRESH OPERATIONS

CROSS REFERENCE TO RELATED APPLICATION

This application is based upon and claims the benefit of priority from Japanese Patent Application No. 2006-064221, filed on Mar. 9, 2006, the entire contents of which are incorporated herein by reference.

BACKGROUND OF THE INVENTION

1. Field of the Invention

The present invention relates to a semiconductor memory automatically executing a refresh operation.

2. Description of the Related Art

A semiconductor memory such as a pseudo SRAM internally and automatically generates a refresh request to execute a refresh operation, while a system is unaware of it. In a semiconductor memory of this kind, in consideration of the conflict between the external access request and the internal refresh request, an access cycle time (timing specification) as a minimum supply interval for external access requests is set longer than the time actually necessary for an access operation. This allows the insertion of the refresh operation between the access operations.

On the other hand, a semiconductor memory such as a DRAM needs to receive a refresh request in addition to an access request during a normal operation mode in which an access operation is executable. Further, the semiconductor memory such as a DRAM has a self-refresh mode in which an access operation is not executed and only an internal refresh operation is automatically executed.

Japanese Unexamined Patent Application Publication No. Hei 7-226077 and Japanese Unexamined Patent Application Publication No. 2005-203092 describe methods in which an address indicating a bank to be refreshed and an address indicating a bank to be accessed are received from an exterior and a refresh operation and an access operation are executed for different banks. Japanese Unexamined Patent Application Publication No. Hei 10-134569 describes a method in which a bank for which an access operation is not executed is designated from an exterior and only the designated bank is shifted to a self-refresh mode.

In the aforesaid pseudo SRAM, by setting a long access cycle time, the conflicting refresh operation and access operation are sequentially executable. However, in order to improve reliability, the refresh operation is executed with higher priority than the access operation. Therefore, for example, in a read operation, the access time from the supply of a read command to the output of read data is set to be long.

In the aforesaid DRAM, in order to avoid the conflict between the access operation and the refresh operation, a bank to be refreshed is designated from the exterior of the DRAM. That is, the control for avoiding the conflict between the access operation and the refresh operation is performed in the exterior of the DRAM.

Conventionally, no method has been proposed for avoiding the conflict between an access operation and a refresh operation without setting the access cycle time and the access time long in a semiconductor memory internally and automatically generating a refresh request and in which the access operation and the refresh operation may conflict with each other.

SUMMARY OF THE INVENTION

It is an object of the present invention to shorten the access cycle time in a semiconductor memory automatically executing a refresh operation.

In response to an externally supplied access request, a semiconductor memory executes an access operation in which data is inputted or outputted to/from one of a plurality of memory blocks. At this time, in response to the access request, a memory control unit executes the access operation on one of the memory blocks and a refresh operation on at least one of the memory blocks on which the access operation is not executed.

Specifically, when a refresh hold circuit corresponding to a memory block on which the access operation is not executed holds a refresh request, in response to the access request, the access operation is executed on the memory block and the refresh operation is executed on a memory block corresponding to the refresh hold circuit holding the refresh request. This makes it possible to execute the refresh operation during the execution of the access operation without any conflict between the access operation and the refresh operation. As a result, the access cycle time can be shortened, which can improve the data transfer rate.

For example, it is possible to hide the refresh operation behind the access operation by simultaneously executing the access operation and the refresh operation on the memory blocks with use of an access control signal synchronous with a common timing signal. As a result, the access cycle time and the access time can be set depending only on the execution time for the access operation, without the execution time for the refresh operation taken into consideration.

The semiconductor memory outputs an external overlap signal to a controller when the refresh hold circuit holding the refresh request receives a new refresh request. A controller outputs a dummy access request in response to the external overlap signal. In response to the dummy access request, a block control circuit of the semiconductor memory executes the refresh operation to a memory block corresponding to the refresh hold circuit overlappingly holding the refresh requests. This makes it possible to temporarily suspend an access cycle to execute the refresh operation, in a case where the refresh operation corresponding to the refresh request is not executable over a long period of time. As a result, it is possible to prevent loss of data held in the semiconductor memory, thereby improving reliability of the semiconductor memory.

Being notified, by the external overlap signal, of the fact that the refresh requests have overlapped, the controller can correctly recognize an internal state of the semiconductor memory and access the semiconductor memory without causing any malfunction thereof. It may be configured that the dummy access request is internally generated in the semiconductor memory after output of the external overlap signal to execute the refresh operation on the memory block corresponding to the refresh hold circuit overlappingly holding the refresh requests. This can simplify the control by the controller.

According to the present invention, it is possible to shorten the access cycle time in a semiconductor memory automatically executing a refresh operation.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is another explanatory diagram of showing an example of an operation of the semiconductor memory according to the first embodiment;

FIG. 6 is another explanatory diagram of showing an example of an operation of the semiconductor memory according to the first embodiment;

DESCRIPTION OF THE PREFERRED EMBODIMENTS

Figure 1:
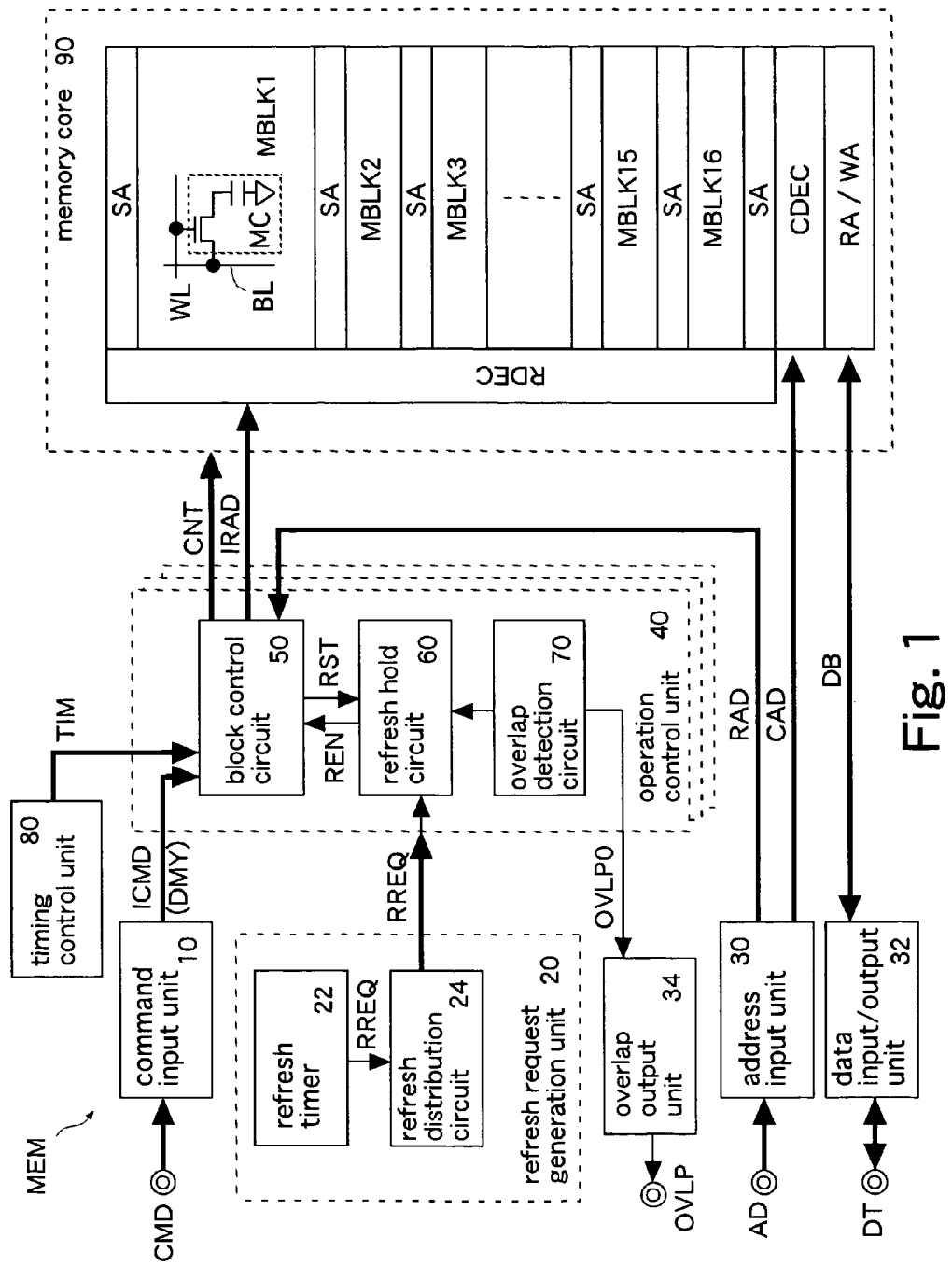
FIG. 1 is a block diagram showing a semiconductor memory of a first embodiment in the present invention.

Preferred embodiments of the invention will now be described with reference to the accompanying drawings. In the drawings, a bold signal line denotes a plurality of signal lines. A part of a block connected to a bold line is composed of a plurality of circuits. A signal line through which a signal is transferred is denoted by a symbol equal to the name of the signal. Double circles in the drawings denote an external terminal.

FIG. 1 shows a semiconductor memory of a first embodiment in the present invention. A semiconductor memory MEM is, for example, a pseudo SRAM. The pseudo SRAM has memory cells of a DRAM and the same input/output interface as that of a SRAM. The pseudo SRAM internally and automatically executes a refresh operation of the memory cells.

Figure 3:
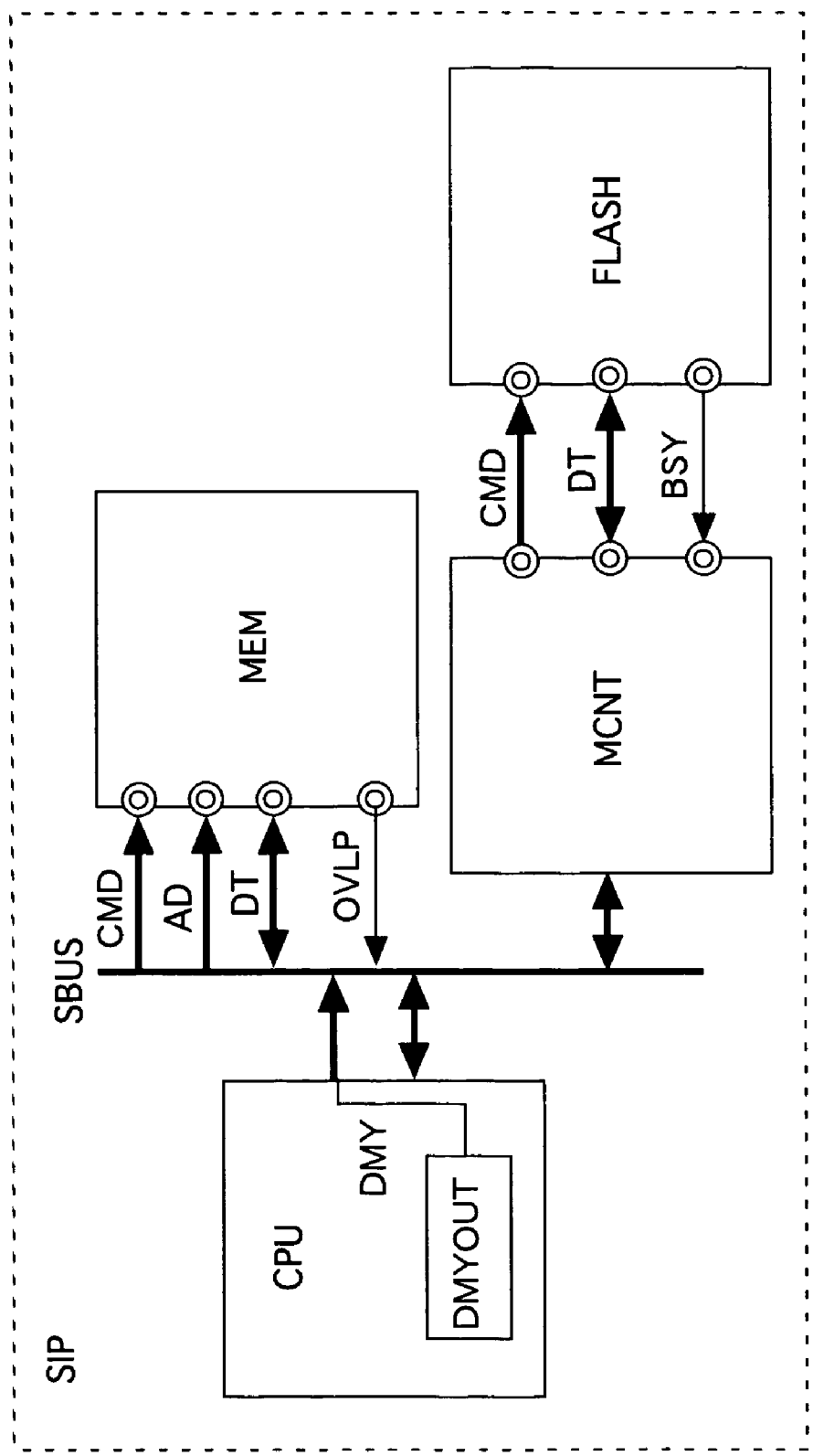
FIG. 3 is a block diagram showing an overview of the memory system according to the first embodiment.

The memory MEM includes a command input unit 10, a refresh request generation unit 20, an address input unit 30, a data input/output unit 32, an overlap output unit 34, operation control units 40, a timing control unit 80, and a memory core 90 having memory blocks 1-16. The operation control units 40 are formed in correspondence with the respective memory blocks MBLK1-16 in order to control the operations of the memory blocks MBLK1-16. The memory MEM and a CPU constitute a memory system as shown in FIG. 3 to be described later.

The command input unit 10 receives an access command CMD supplied to a command terminal CMD to output the received access command CMD as an internal command ICMD to block control circuits 50. In this embodiment, a read command, a write command, and a dummy command DMY (dummy access request) are supplied as the access command CMD to the command input unit 10. The read command is an access request for executing a read operation (access operation) for one of the later-described memory blocks MBLK to read data from the memory block MBLK. The write command is an access request for executing a write operation (access operation) for one of the memory blocks MBLK to write data to the memory block MBLK. The dummy command DMY is a command accompanied by no access operation.

The refresh request generation unit 20 has a refresh timer 22 and a refresh distribution circuit 24. The refresh timer 22 generates a refresh request RREQ (internal access request) at a predetermined cycled. The refresh distribution circuit 24 outputs the refresh request RREQ to one of the operation control units 40 in order to make a refresh operation executed for one of the memory blocks MBLK. The refresh distribution circuit 24 shifts a destination of the refresh request RREQ to the next operation control unit 40 every time it receives the refresh request RREQ. Each of the operation control units 40 receives the refresh request RREQ once while the refresh request RREQ is outputted 16 times.

The address input unit 30 receives an external address AD supplied to an address terminal AD to output the received external address AD to the operation control units 40 and the memory core 90. The external address AD is composed of a row address RAD (high-order address) for selecting a word line WL and a column address CAD (low-order address) for selecting a bit line BL. The row address RAD includes a block address for identifying the memory block MBLK1-16. The row address RAD and the column address CAD are simultaneously supplied to the address terminal AD.

The data input/output unit 32 outputs, to a data terminal DT, read data outputted thereto from the memory core 90 via a data bus DB during the read operation, and outputs write data, which is received at the data terminal DT during a write operation, to the memory core 90 via the data bus DB. The data terminal DT is a terminal common to the read data and the write data and is composed of, for example, 8 bits.

The overlap output unit 34 activates an external overlap signal OVLP in response to the activation of an overlap signal OVLP0 outputted from any of the operation control units 40. Activation level/inactivation level of the overlap signals OVLP0, OVLP are high-logic level/low-logic level. The overlap signals OVLP0, OVLP will be described in FIG. 2 to be described later.

Each of the operation control units 40 has a block control circuit 50, a refresh hold circuit 60, and an overlap detection circuit 70. When receiving the refresh request RREQ, the refresh hold circuit 60 holds this refresh request RREQ, and keeps a refresh enable signal REN active while holding the refresh request RREQ. When receiving a reset signal RST, the refresh hold circuit 60 cancels the held refresh request RREQ in response to this reset signal RT and inactivates the refresh enable signal REN. This can prevent the refresh request RREQ corresponding to the finished refresh operation from being accumulated in the refresh hold circuit 60, which can prevent a malfunction of the memory MEM.

The overlap detection circuit 70 monitors a state of the refresh hold circuit 60, and outputs the overlap signal OVLP0 when detecting that the refresh hold circuit 60 holding the refresh request RREQ is supplied with a new refresh request RREQ.

The block control circuits 50 execute the access operation (read operation or write operation) for the memory block MBLK in response to the internal access command ICMD, and when the refresh hold circuits 60 corresponding to the memory blocks MBLK for which the access operation is not executed keep the refresh enable signal REN active, they execute the refresh operation for one of the corresponding memory blocks MBLK. That is, when the refresh hold circuits 60 hold the refresh requests RREQ, one of the corresponding memory blocks MBLK for which the access operation is not executed executes the refresh operation in synchronization with the access operation.

More specifically, the block control circuit 50 executing the access operation outputs an operation control signal CNT for executing the read operation or the write operation for the memory block MBLK and an internal row address signal IRAD for selecting one of the word lines WL in the memory block MBLK. The block control circuit 50 executing the refresh operation outputs the operation control signal CNT for executing the refresh operation for the memory block MBLK and the internal row address signal IRAD for selecting one of the word lines WL in the memory block MBLK. Here, since the block control circuits 50 are formed in correspondence with the memory blocks MBLK1-16 respectively, the internal row address signal IRAD does not include a block address.

The refresh request generation unit 20 and the operation control units 40 function as a memory control unit that executes, in response to the access command CMD (access request), the access operation for one of the memory blocks MBLK and also executes the refresh operation for at least one of the memory blocks MBLK for which the access operation is not executed.

The timing control unit 80 outputs a timing signal TIM for determining the generation timing of the operation control signals CNT outputted from the block control circuits 50. The timing signal TIM is a signal used commonly by all the block control circuits 50. Therefore, the block control circuit 50 executing the access operation and the block control circuit 50 executing the refresh operation output the operation control signals CNT at the same timing. In other words, the access operation (read operation or write operation) and the refresh operation are executed in synchronization with each other. This can hide the refresh operation behind the access operation. As a result, it is possible to set the access cycle time and the access time depending only on the execution time of the access operation, without any consideration of the execution time of the refresh operation, which can shorten the access cycle time and the access time compared with those in a conventional pseudo SRAM.

The memory core 90 has a row address decoder RDEC, a column address decoder CDEC, a read amplifier RA, a write amplifier WA, sense amplifiers SA, and the memory blocks MBLK1-16. Each of the memory blocks MBLK1-16 has dynamic memory cells MC, and word lines WL and bit line BL connected to the memory cells MC. The row address decoder RDEC, the column address decoder CDEC, the read amplifier RA, and the write amplifier WA are circuit blocks common to all the memory blocks MBLK1-16. The sense amplifiers SA are arranged between the pair of memory blocks MBLK adjacent to each other and on outer sides of the memory blocks MBLK1, MBLK16. The sense amplifier SA positioned between the memory blocks MBLK is used commonly by these memory blocks MBLK. Therefore, the memory blocks MBLK adjacent to each other (for example, MBLK2 and MBLK3) cannot operate simultaneously. The memory block MBLK to operate is selected by the block control circuits 50. At the time of the read operation, the read amplifier RA amplifies read data amplified by the sense amplifier SA and outputted via a not-shown column switch. At the time of the write operation, the write amplifier WA amplifies write data supplied via the data bus DB to supply the write data to the bit line BL.

Figure 2:
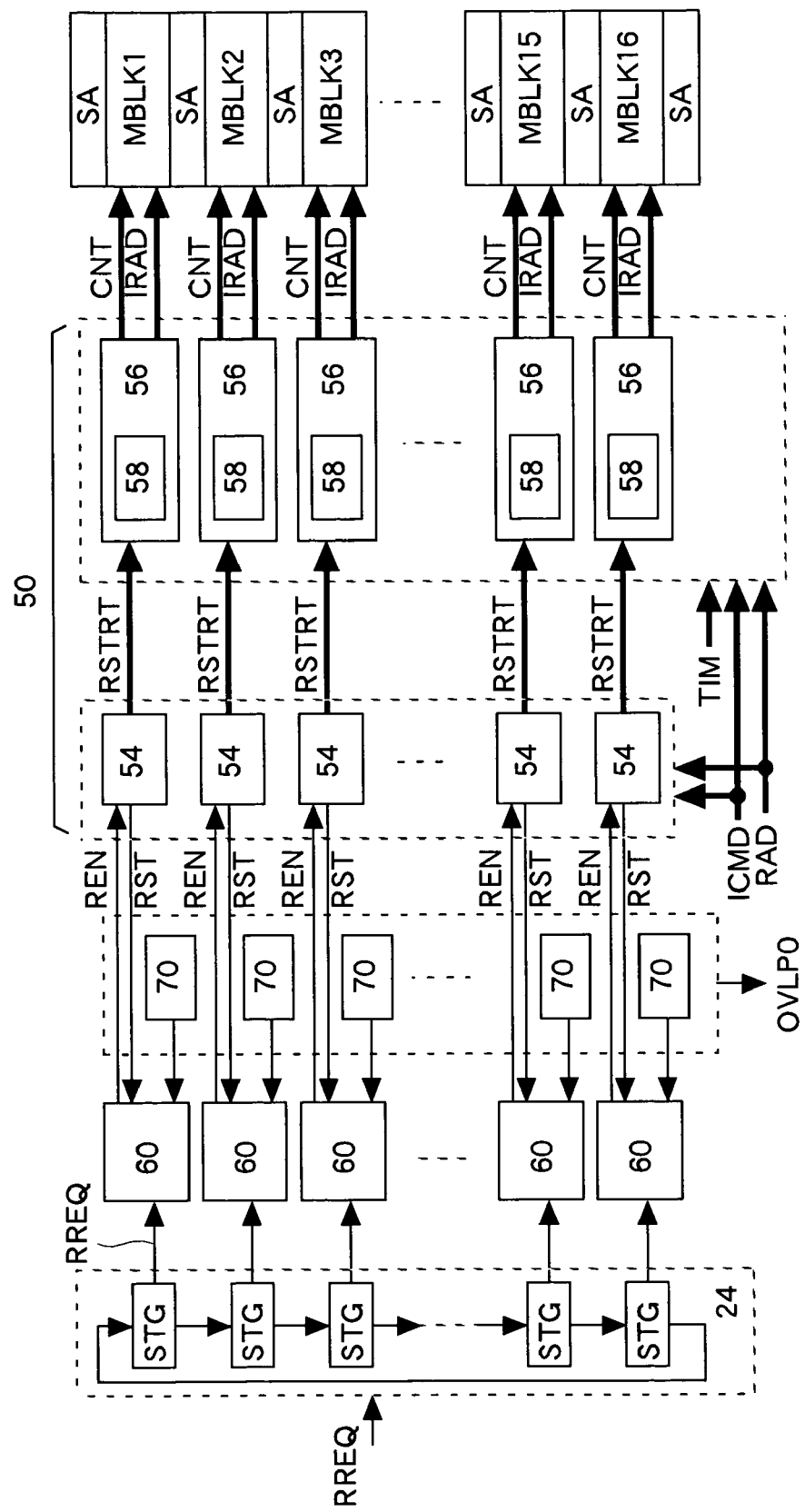
FIG. 2 is a block diagram showing the details of the essential parts of FIG. 1.

FIG. 2 shows the details of essential parts of FIG. 1. The refresh distribution circuit 24 has 16 memory stages connected in series and corresponding to the memory blocks MBLK1-16 respectively. An output of the final stage STG is connected to an input of the initial stage STG. When the memory MEM is initialized at the power-on time, a memory state of one of the memory stages STG is set to high-logic level, and memory states of the other stages are set to low-logic level. The memory stage STG holding the high-logic level outputs the refresh request RREQ. The memory state of the memory stage STG holding the high-logic level is shifted to the adjacent memory stage STG (lower side in the drawing) in synchronization with the refresh request RREQ (a trigger signal) outputted from the refresh timer 22. That is, the refresh distribution circuit 24 functions as a shift register performing a shift operation in response to the refresh request RREQ outputted from the refresh timer 22. Each of the memory stages STG outputs the refresh request RREQ once every time the refresh distribution circuit 24 receives one of the 16 refresh requests RREQ outputted from the refresh timer 22.

Each of the refresh hold circuits 60 holds the refresh request RREQ outputted from the corresponding memory stage STG. Each of the block control circuits 50 has a refresh control circuit 54 and an access control circuit 56. Pairs of the block control circuit 50 and the refresh hold circuit 60 (operation control units 40) are arranged in an arrangement direction of the memory blocks MBLK1-16 (vertical direction in the drawing) in correspondence with the memory blocks MBLK1-16. The refresh distribution circuit 24 outputs the refresh request RREQ to the refresh hold circuits 60 provided in line in the arrangement direction, sequentially in their arrangement order. This makes it possible to configure the refresh distribution circuit 24 with a simple shift register.

The refresh control circuit 54 outputs a refresh start signal RSTRT to the corresponding access control circuit 56 in order to execute the refresh operation for the corresponding memory block MBLK, if this memory block MBLK is not adjacent to the memory block MBLK for which the access operation (read operation or write operation) is executed. This can prevent the memory block MBLK for which the access operation is executed and the memory block MBLK for which the refresh operation is executed from conflicting with each other in the sense amplifier SA.

The refresh start signal RSTRT can be outputted from the refresh control circuit 54 receiving the refresh enable signal REN. When the plural refresh control circuits 54 are receiving the refresh enable signal REN, the order in which they output the refresh start signal RSTRT corresponds to the order in which they receive the refresh enable signal REN. In other words, the refresh control circuits 54 determine the order in which the memory blocks MBLK undergo the refresh operation, according to the order in which the refresh hold circuits 60 hold the refresh request RREQ. For this purpose, the refresh control circuits 54 monitor each other the order in which they receive the refresh enable signal REN.

Even in a case where the plural refresh hold circuits 60 hold the refresh request RREQ, the refresh start signal RSTRT is outputted from only one of the refresh control circuits 54. Therefore, the refresh operation is executed for only one of the memory blocks MBLK in synchronization with the access operation. By the setting such that the number of the memory blocks MBLK that operate simultaneously is two, it is possible to reduce operating current compared with a case where the refresh operations for the plural memory blocks MBLK are executed in synchronization with the access operation. As a result, the wiring width of power supply wiring and so on can be reduced to a minimum, which can prevent the increase in chip size of the memory MEM.

As described above, the refresh control circuits 54 function as refresh order control circuits that determine the order (priority sequence) for executing the refresh operation when the plural refresh hold circuits 60 hold the refresh request RREQ. This enables efficient execution of the refresh operation and the access operation without any conflict therebetween. The function as the refresh order control circuits will be described in detail in FIG. 4 to FIG. 6 to be described later.

Further, the refresh control circuits 54 function as refresh reservation circuits that, when the refresh hold circuit 60 corresponding to the memory block MBLK adjacent to the memory block MBLK for which the access operation is executed holds the refresh request RREQ, reserve the execution of the refresh operation responding to the hold. This can prevent the same sense amplifier SA from being used for the access operation and the refresh operation, which can prevent a malfunction of the memory MEM. The function as the refresh reservation circuits will be described in detail in FIG. 4 to FIG. 6 to be described later.

Each of the access control circuits 56 has a refresh address counter 58 for generating a refresh address indicating a word line WL for which the refresh operation is executed. The refresh address counter 58 performs a count operation every time it receives the refresh start signal RSTRT to update the refresh address. The access control circuit 56 outputs the row address RAD as an internal row address IRAD when the access operation is to be executed, while outputting the refresh address generated by the refresh address counter 58, as the internal row address IRAD when the access operation is to be executed. The refresh address counters 58 are formed in correspondence with the respective access control circuits 56, so that the refresh operations for different refresh addresses can be executed for arbitrary ones of the memory blocks MBLK1-16. As a result, the control of the refresh operation by the block control circuits 50 can be made simple.

In the memory MEM of this embodiment, the specification of the access cycle time, which is the minimum supply interval for the access requests, is designed to be shorter than the sum of the access operation time taken to execute the access operation for each of the memory blocks MBLK once and the refresh operation time taken to execute the refresh operation for each of the memory blocks MBLK once. Therefore, the refresh operation and the access operation cannot be separately executed within the access cycle time. However, the memory MEM is capable of simultaneously executing the access operation and the refresh operation for the memory blocks MBLK different from each other in synchronization with the access request. Accordingly, the access cycle time and the access operation time in a case where the refresh operation and the access operation are both executed is equal to the access cycle time and the access operation time in a case where the access operation is executed without executing the refresh operation. As a result, the access cycle time and the access operation time can be made shorter compared with those of a conventional pseudo SRAM.

FIG. 3 shows an overview of a memory system according to the first embodiment. In this embodiment, the memory system is formed as a system-in-package SIP integrated on a silicon substrate. The SIP has the memory MEM shown in FIG. 1, a flash memory FLASH, a memory controller MCNT accessing the flash memory FLASH, and a CPU controlling the whole system. The CPU, the memory MEM, and the memory controller MCNT are connected to one another via a system bus SBUS.

The CPU outputs the access command CMD, the external address AD, and the write data DT in order to access the memory MEM, and receives the read data DT from the memory MEM. The CPU has a dummy request output circuit DMYOUT that suspends the supply of the access command CMD (read command and write command) to the memory MEM for one access cycle period when receiving the activated overlap signal OVLP from the memory MEM, and outputs the dummy command DMY as the access command CMD. The memory MEM receiving the dummy command DMY does not execute the access operation but executes only the refresh operation for the memory block MBLK corresponding to the refresh hold circuit 60 overlappingly holding the refresh requests RREQ.

Figure 4:
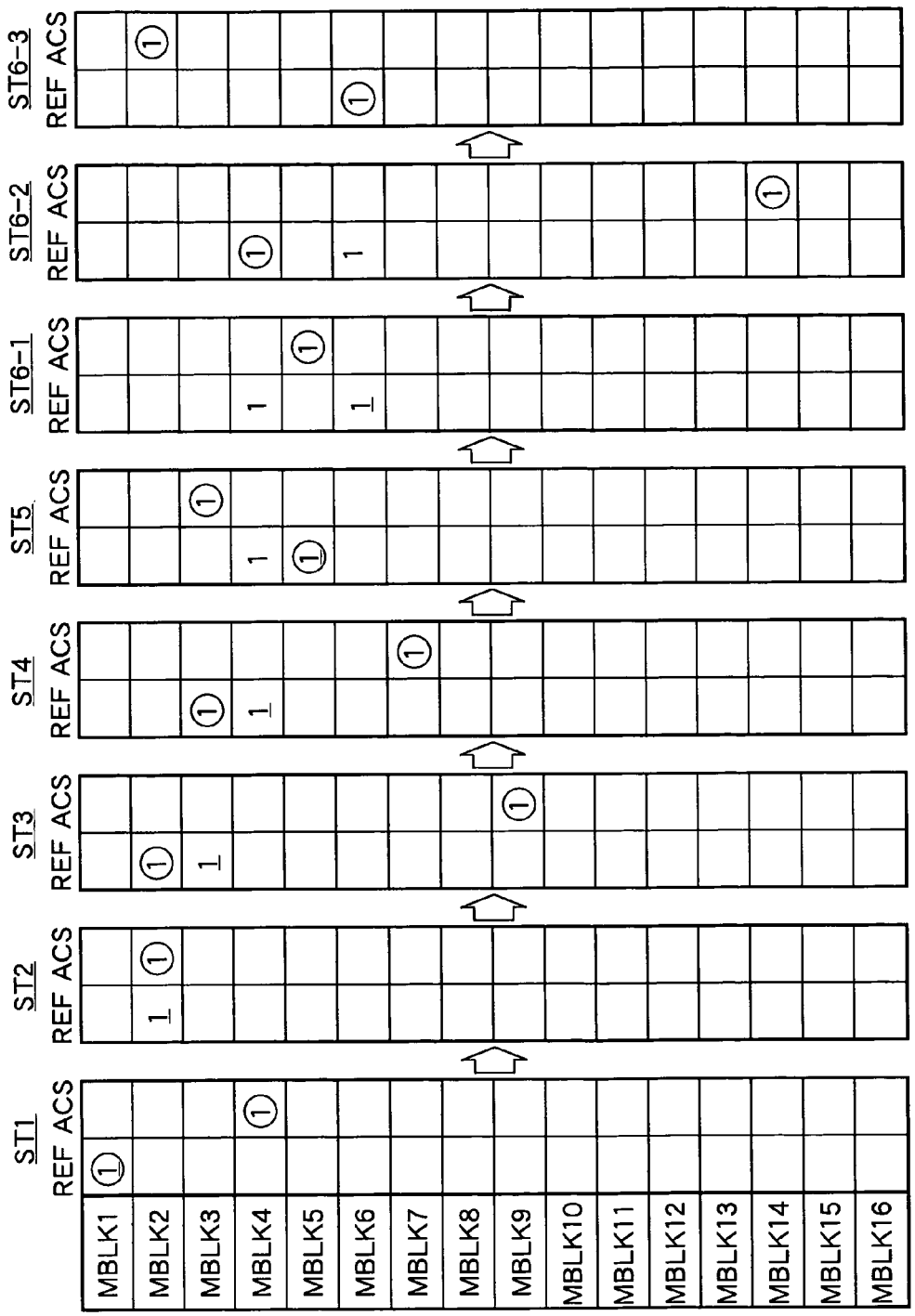
FIG. 4 is an explanatory diagram of showing an example of an operation of the semiconductor memory according to the first embodiment.
Figure 5:
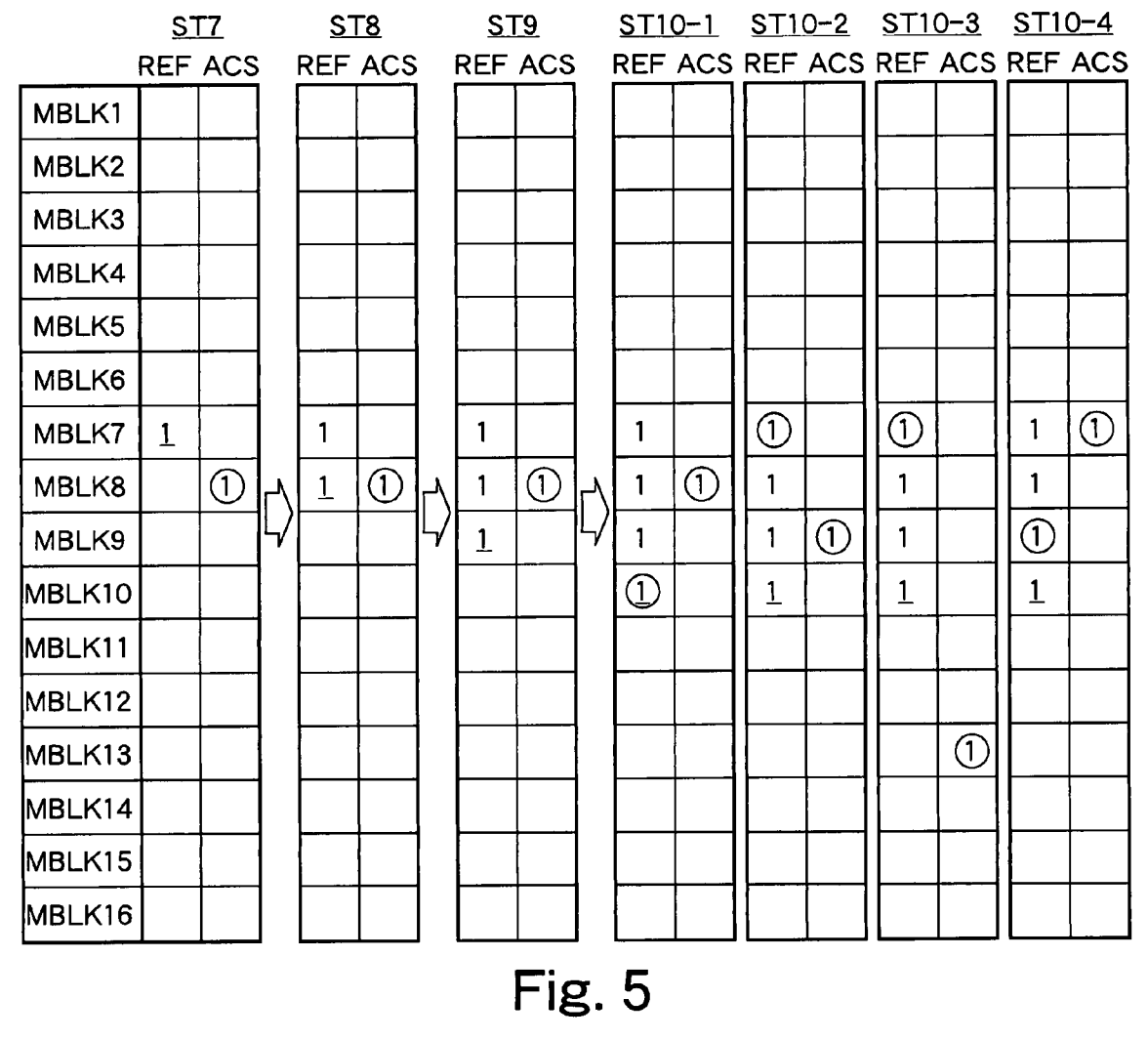
Figure 6:
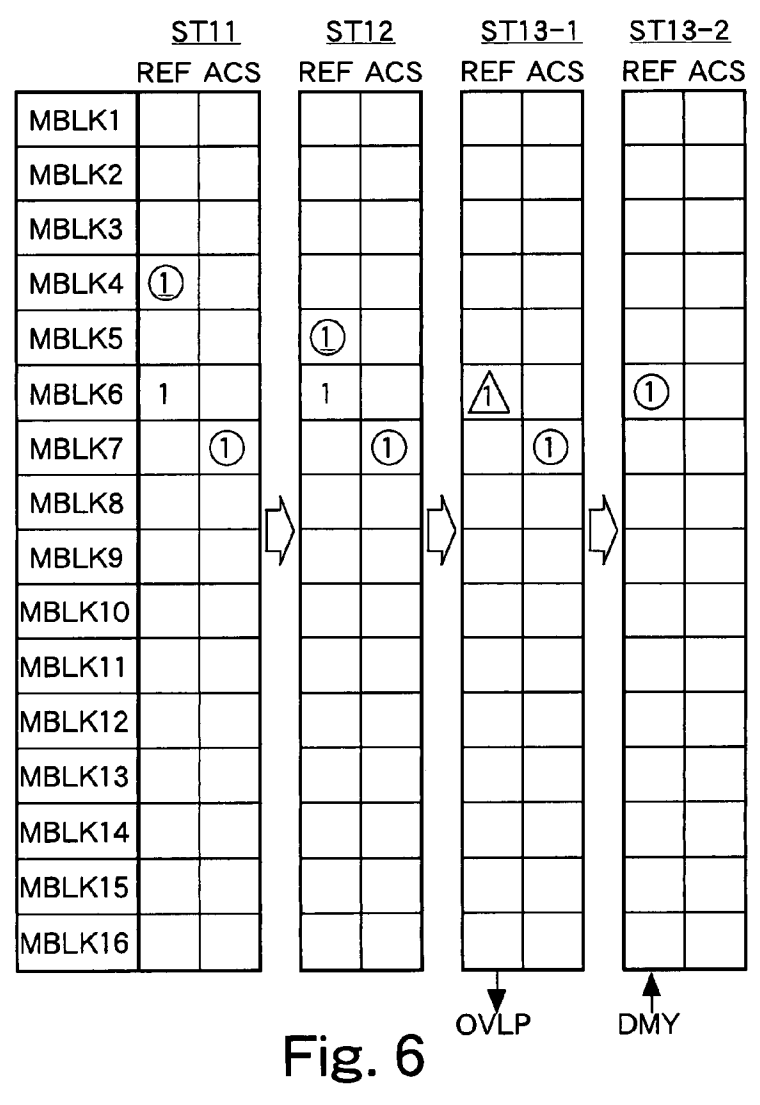

FIG. 4-FIG. 6 show examples of the operation of the semiconductor memory MEM according to the first embodiment. In each of states ST1, ST2, . . . , ST13-2, "1" in the "REF" columns indicates that the refresh hold circuit 60 corresponding to each of the memory blocks MBLK1-16 holds the refresh request RREQ. The circled "1" in the "REF" columns indicates that the refresh operation is executed in synchronization with the access operation (read operation or write operation). The underlined "1" in the "REF" columns indicates the refresh request that has been held most lately. The circled "1" in the "ACS" columns indicates that the access request (read request or write request) is supplied to the corresponding memory block MBLK1-16 and the access operation is executed.

In an actual memory system, a controller such as a CPU accessing the memory MEM is capable of supplying the access request about 100 times during a generation period of the refresh request. A large number of access requests accompanied by no refresh request are supplied during a period between the two states ST shown in the drawing. Therefore, the probability is high that the refresh operation corresponding to the refresh request held in the refresh hold circuit 60 is executed in synchronization with an access operation that is supplied before a next refresh request is generated. However, for easier understanding of the invention, the description of FIG. 4-6 will be given on assumption that the access request and the refresh request are generated at the same ratio.

First, in the state ST1, a refresh request for the memory block MBLK1 is generated and an access request for the memory block MBLK4 is supplied. Based on the states of the other refresh control circuits 54 and the row address signal RAD, the refresh control circuit 54 corresponding to the memory block MBLK1 confirms that neither a refresh request nor an access request for the memory block MBLK1 and for the memory block MBLK2 adjacent to the memory block MBLK1 has been supplied, and judges that it can execute a refresh operation. Then, the refresh control circuit 54 corresponding to the memory block MBLK1 outputs the refresh start signal RSTRT. Consequently, the refresh operation for the memory block MBLK1 is executed in synchronization with an access operation for the memory block MBLK4. Since the refresh operation is executed, the refresh request held in the corresponding refresh hold circuit 60 is canceled. Note that by setting the start timing of the refresh operation slightly different from the start timing of the access operation, it is possible to reduce the number of circuits starting the operations simultaneously, which can reduce peak current of the memory MEM.

In the state ST2, a refresh request is held in the refresh hold circuit 60 corresponding to the memory block MBLK2 for which an access operation is executed. Based on the states of the other refresh control circuits 54 and the row address signal RAD, the refresh control circuit 54 corresponding to the memory block MBLK2 confirms that an access request for the memory block MBLK2 has been supplied and judges that it cannot execute a refresh operation. Therefore, the refresh control circuit 54 corresponding to the memory block MBLK2 prohibits the output of the refresh start signal RSTRT. Consequently, the refresh operation for the memory block MBLK2 is reserved and only the access operation for the memory block MBLK2 is executed.

In the state ST3, a refresh request for the memory block MBLK3 is newly generated and an access request for the memory block MBLK9 is supplied. Based on the states of the other refresh control circuits 54 and the row address signal RAD, the refresh control circuit 54 corresponding to the memory block MBLK3 confirms that the refresh request for the adjacent memory block MBLK2 (its number is smaller than that of the memory block MBLK3) has been supplied, and judges that it cannot execute a refresh operation. Based on the states of the other refresh control circuits 54 and the row address signal RA, the refresh control circuit 54 corresponding to the memory block MBLK2 confirms that the refresh request for the adjacent memory block MBLK1 (its number is smaller than that of the memory block MBLK2) does not exist, and judges that it can execute the refresh operation. Consequently, the refresh operation for the memory block MBLK3 is reserved and the refresh operation for the memory block MBLK2 is executed in synchronization with an access operation for the memory block MBLK9.

In a case where the plural refresh hold circuits 60 hold the refresh requests, the refresh operation of the memory block MBLK corresponding to the refresh hold circuit 60 that has held the refresh request first is executed with higher priority. That is, the refresh control circuits 54 function as the refresh order control circuits that execute the refresh operation according to the order in which the refresh hold circuits 60 hold the refresh requests. By giving higher priority to the execution of the refresh operation corresponding to the older refresh request, it is possible to surely hold data written to the memory cell MC, which can improve reliability of the memory MEM.

In the state ST4, a refresh request for the memory block MBLK4 is newly generated and an access request for the memory block MBLK7 is supplied. The refresh request for the memory block MBLK3 has already been held. In this case, as in the state ST3, a refresh operation for the memory block MBLK4 is reserved and the refresh operation for the memory block MBLK3 is executed in synchronization with an access operation for the memory block MBLK7.

In the state ST5, a refresh request for the memory block MBLK5 is newly generated and an access request for the memory block MBLK3 is supplied. The refresh request for the memory block MBLK4 has already been held. Based on the states of the other refresh control circuits 54 and the row address signal RAD, the refresh control circuit 54 corresponding to the memory block MBLK4 confirms that the access request for the adjacent memory block MBLK3 has been supplied, and judges that it cannot execute a refresh operation. Based on the states of the other refresh control circuits 54 and the row address signal RAD, the refresh control circuit 54 corresponding to the memory block MBLK5 confirms that the refresh request for the adjacent memory block MBLK4 (its number is smaller than that of the memory block MBLK5) exits. Further, the refresh control circuit 54 corresponding to the memory block MBLK5 monitors the state of the refresh control circuit 54 corresponding to the memory block MBLK4 to judge that the refresh operation corresponding to the adjacent memory block MBLK4 is not executable due to the influence of an access operation, and judges that it can execute a refresh operation. Consequently, the refresh operation for the memory block MBLK4 is reserved and the refresh operation for the memory block MBLK5 is executed in synchronization with the access operation for the memory block MBLK3.

Even in a case where the refresh hold circuit 60 corresponding to the adjacent memory block MBLK holds an old refresh request but a refresh operation to this memory block MBLK is not executable due to the conflict with an access request, a refresh operation corresponding to a newly generated refresh request (the memory block MBLK assigned a larger number) is executed with higher priority. This can prevent the accumulation of the refresh request whose corresponding refresh operation is executable, which can lower the probability that the overlap signal OVLP is outputted. Therefore, the data transfer rate of the memory MEM can be improved, which can improve performance of the system.

The state ST6-1 to the state ST6-3 show the operations from the supply of a refresh request for the memory block MBLK6 to the execution of a refresh operation corresponding to this refresh request. In the state ST6-2 and the state ST6-3, no new refresh request is generated.

First, in the state ST6-1, the refresh request for the memory block MBLK6 is newly generated and an access request for the memory block MBLK5 is supplied. The refresh request for the memory block MBLK4 has already been held. Based on the states of the other refresh control circuits 54 and the row address signal RAD, the refresh control circuits 54 corresponding to the memory blocks MBLK4, 6 confirm that the access request for the adjacent memory block MBLK5 has been supplied, and judge that they cannot execute refresh operations. Accordingly, only an access operation for the memory block MBLK5 is executed.

In the state ST6-2, an access request for the memory block MBLK14 is supplied. The refresh requests for the memory blocks MBLK4, 6 have already been held. Based on the states of the other refresh control circuits 54 and the row address signal RAD, the refresh control circuits 54 corresponding to the memory blocks MBLK4, 6 judge that they can execute the refresh operations. Further, each of the refresh control circuits 54 corresponding to the memory blocks MBLK4, 6 monitors the state of the others, and judges that the refresh request for the memory block MBLK4 is older than that for the memory block MBLK6. Consequently, the refresh operation for the memory block MBLK6 is reserved and the refresh operation for the memory block MBLK4 is executed in synchronization with an access operation for the memory block MBLK14.

In the state ST6-3, an access request for the memory block MBLK2 is supplied. The refresh request for the memory block MBLK6 has already been held. In this case, since there is no factor necessitating the reservation of the refresh operation, the refresh operation for the memory block MBLK6 is executed in synchronization with an access operation for the memory block MBLK2. Consequently, there remains no refresh request held in the refresh hold circuits 60.

Next, in FIG. 5, in the state ST7, a refresh request for the memory block MBLK7 is newly generated and an access request for the memory block MBLK8 is supplied. Based on the states of the other refresh control circuits 54 and the row address signal RAD, the refresh control circuit 54 corresponding to the memory block MBLK7 confirms that the access request for the adjacent memory block MBLK8 has been supplied, and judges that it cannot execute a refresh operation. Therefore, only an access operation for the memory block MBLK8 is executed.

In the state ST8, a refresh request for the memory block MBLK8 is newly generated and an access request for the memory block MBLK8 is supplied again. The refresh request for the memory block MBLK7 has already been held. Based on the states of the other refresh control circuits 54 and the row address signal RAD, the refresh control circuits 54 corresponding to the memory blocks MBLK7, 8 confirm that the access request for the memory block MBLK8 has been supplied, and judge that they cannot execute refresh operations. Therefore, only an access operation for the memory block MBLK8 is executed.

In the state ST9, a refresh request for the memory block MBLK9 is newly generated and an access request for the memory block MBLK8 is supplied again. The refresh requests for the memory blocks MBLK7, 8 have already been held. Based on the states of the other refresh control circuits 54 and the row address signal RAD, the refresh control circuits 54 corresponding to the memory blocks MBLK7-9 confirm that the access request for the memory block MBLK8 has been supplied, and judge that they cannot execute refresh operations. Therefore, only an access operation for the memory block MBLK8 is executed.

The state ST10-1 to the state ST1-4 show the operations of the memory MEM when an access request and a refresh request for the memory block MBLK10 are supplied after the state ST9. In other words, one of the state ST10-1 to the state ST10-4 appears after the state ST9.

In the state ST10-1, an access request for the memory block MBLK8 is supplied. Based on the states of the other refresh control circuits 54 and the row address signal RAD, the refresh control circuits 54 corresponding to the memory blocks MBLK7-10 confirm that the access request for the memory block MBLK8 has been supplied, and judge that only a refresh operation for the memory block MBLK10 is executable. Therefore, the refresh operation for the memory block MBLK10 is executed in synchronization with an access operation for the memory block MBLK8.

In the state ST10-2, an access request for the memory block MBLK9 is supplied. Based on the states of the other refresh control circuits 54 and the row address signal RAD, the refresh control circuits 54 corresponding to the memory blocks MBLK7-10 confirm that the access request for the memory block MBLK9 has been supplied, and judge that only a refresh operation for the memory block MBLK7 is executable. Therefore, the refresh operation for the memory block MBLK7 is executed in synchronization with an access operation for the memory block MBLK9.

In the state ST10-3, an access request for the memory block MBLK13 is supplied. Based on the states of the other refresh control circuits 54 and the row address signal RAD, the refresh control circuits 54 corresponding to the memory blocks MBLK7-10 confirm that the access request for the memory block MBLK13 has been supplied, and judge that a refresh operation for one of the memory blocks MBLK7-10 is executable. Further, the refresh control circuits 54 corresponding to the memory blocks MBLK7-10 judge that the refresh request for the memory block MBLK7 is the oldest. Therefore, the refresh operation for the memory block MBLK7 is executed in synchronization with an access operation for the memory block MBLK13.

In the state ST10-4, an access request for the memory block MBLK7 is supplied. Based on the states of the other refresh control circuits 54 and the row address signal RAD, the refresh control circuits 54 corresponding to the memory blocks MBLK7-10 confirm that the access request for the memory block MBLK7 has been supplied, and judge that refresh operations for the memory blocks MBLK7-8 are not executable. Further, the refresh control circuits 54 corresponding to the memory blocks MBLK7-10 judge that the refresh operation for one of the memory blocks MBLK9-10 is executable and judges that the refresh request for the memory block MBLK9 is the older. Therefore, the refresh operation for the memory block MBLK9 is executed in synchronization with an access operation for the memory block MBLK7.

In the state ST11 in FIG. 6, a refresh request for the memory block MBLK4 is newly generated and an access request for the memory block MBLK7 is supplied. A refresh request for the memory block MBLK6 has already been held. In this case, a refresh operation for the memory block MBLK6 is not executable since it conflicts with an access operation. Therefore, a refresh operation for the memory block MBLK4 is executed in synchronization with the access operation for the memory block MBLK7.

In the state ST12, a refresh request for the memory block MBLK5 is newly generated and an access request for the memory block MBLK7 is supplied. The refresh request for the memory block MBLK6 has already been held. In this case, as in the above-described state ST11, a refresh operation for the memory block MBLK5 is executed in synchronization with an access operation for the memory block MBLK7.

In the state ST13-1, a refresh request for the memory block MBLK6 is newly generated and an access request for the memory block MBLK7 is supplied. However, in the state ST12, the refresh operation for the memory block MBLK6 has not been executed. Therefore, the refresh hold circuit 60 corresponding to the memory block MBLK6 receives the new refresh request while holding the refresh request. That is, there occurs the overlap of the refresh requests. Here, the overlap state is shown by the triangular mark.

The overlap detection circuit 70 corresponding to the memory block MBLK6 outputs the overlap signal OVLP0. The overlap output unit 34 outputs the external overlap signal OVLP to an exterior of the memory MEM in response to the overlap signal OVLP0. The CPU shown in FIG. 3 receives the overlap signal OVLP at, for example, an interruption terminal. The refresh control circuit 54 corresponding to the memory block MBLK6 judges that it cannot execute the refresh operation since this refresh operation conflicts with an access operation for the memory block MBLK7. Therefore, only the access operation for the memory block MBLK7 is executed.

In the state ST13-2, the CPU receiving the overlap signal OVLP at the interruption terminal does not supply an access request (access command CMD) to the memory MEM but supplies the dummy command DMY (dummy access request). For example, the CPU outputs a refresh command or an auto refresh command of a DRAM as the dummy command DMY. Therefore, a circuit such as the CPU need not be modified so as to be adapted to the memory MEM of this embodiment.

The dummy command DMY is supplied to all the refresh control circuits 54. The refresh control circuit 54 (memory block MBLK6) corresponding to the overlap detection circuit 70 that has outputted the overlap signal OVLP0 outputs the refresh start signal RSTRT in response to the dummy command DMY. Consequently, the refresh operation for the memory block MBLK6 is executed.

Note that the access control circuits 56 do not recognize the dummy command DMY as the access command. By neglecting the dummy command DMY, the access control circuits 56 do not execute an access operation even when the address AD used in a previous access operation is held in an address latch or the like. This can prevent the collision of the refresh operation and the access operation, which prevents a malfunction of the memory MEM.

In the first embodiment described above, when the refresh hold circuit 60 holds the refresh request RREQ, it is possible to execute the refresh operation during the execution of the access operation without any conflict between the access operation and the refresh operation. As a result, in a pseudo SRAM automatically executing the refresh operation without externally receiving the refresh request RREQ, the access cycle time and the access time can be shortened, which can improve the data transfer rate between a controller such as the CPU and the memory MEM.

When the refresh hold circuit 60 holding the refresh request RREQ receives a new refresh request RREQ, the overlap signal OVLP is outputted and the dummy command DMY is received from the controller such as the CPU, so that it is possible to execute the refresh operation for the memory block MBLK corresponding to the refresh hold circuit 60 overlappingly holding the refresh requests RREQ. In a case where the refresh operation corresponding to the refresh request is not executable over a long time, it is possible to temporarily suspend the access cycle to execute the refresh operation. As a result, breakage of data held in the memory MEM can be prevented, which improve reliability of the memory MEM.

Being notified of the overlap of the refresh requests RREQ by the overlap signal OVLP, the controller such as the CPU can correctly recognize the internal state of the memory MEM and can access the memory MEM without causing any malfunction thereof.

Figure 7:
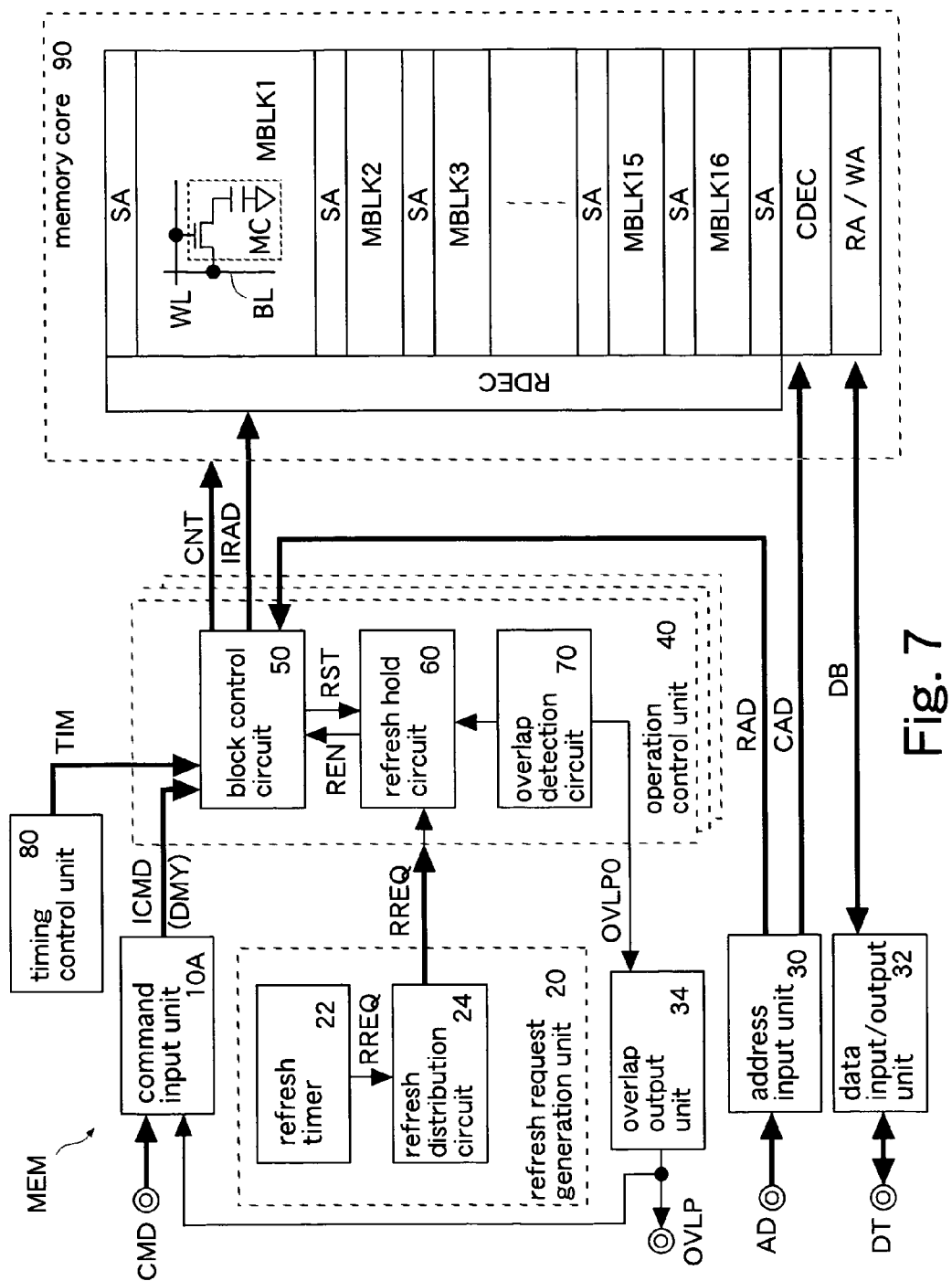
FIG. 7 is a block diagram showing a semiconductor memory of a second embodiment in the present invention.

FIG. 7 shows a semiconductor memory according to a second embodiment in the present invention. The same reference symbols are used to designate the same elements as the elements described in the first embodiment, and detailed description thereof will be omitted. A semiconductor memory MEM of this embodiment has a command input unit 10A in place of the command input unit 10 of the first embodiment. The other configuration is the same as that of the first embodiment. That is, the semiconductor memory MEM is formed as a pseudo SRAM. For example, the memory MEM and a CPU or the like constitute a SIP as shown in FIG. 3.

The command input unit 10A outputs a dummy command DMY (dummy access request) in response to the activation of an overlap signal OVLP outputted from an overlap output unit 34. That is, the command input unit 10A functions as a dummy access generation unit generating the dummy access request while the overlap signal OVLP is outputted. Block control circuits 50 do not execute an access operation and execute only a refresh operation in an access cycle next to an access cycle where they receive the dummy command DMY, as in the aforesaid state ST13-2 in FIG. 6.

The above-described second embodiment can also provide the same effects as those of the first embodiment previously described. In addition, in this embodiment, the dummy command DMY is internally generated in the memory MEM and then the refresh operation is executed. Therefore, a controller accessing the memory MEM need not have a function of outputting the dummy command DMY. This makes it possible to configure a pseudo SRAM capable of shortening the access cycle time without any correction of the function of the controller.

Figure 8:
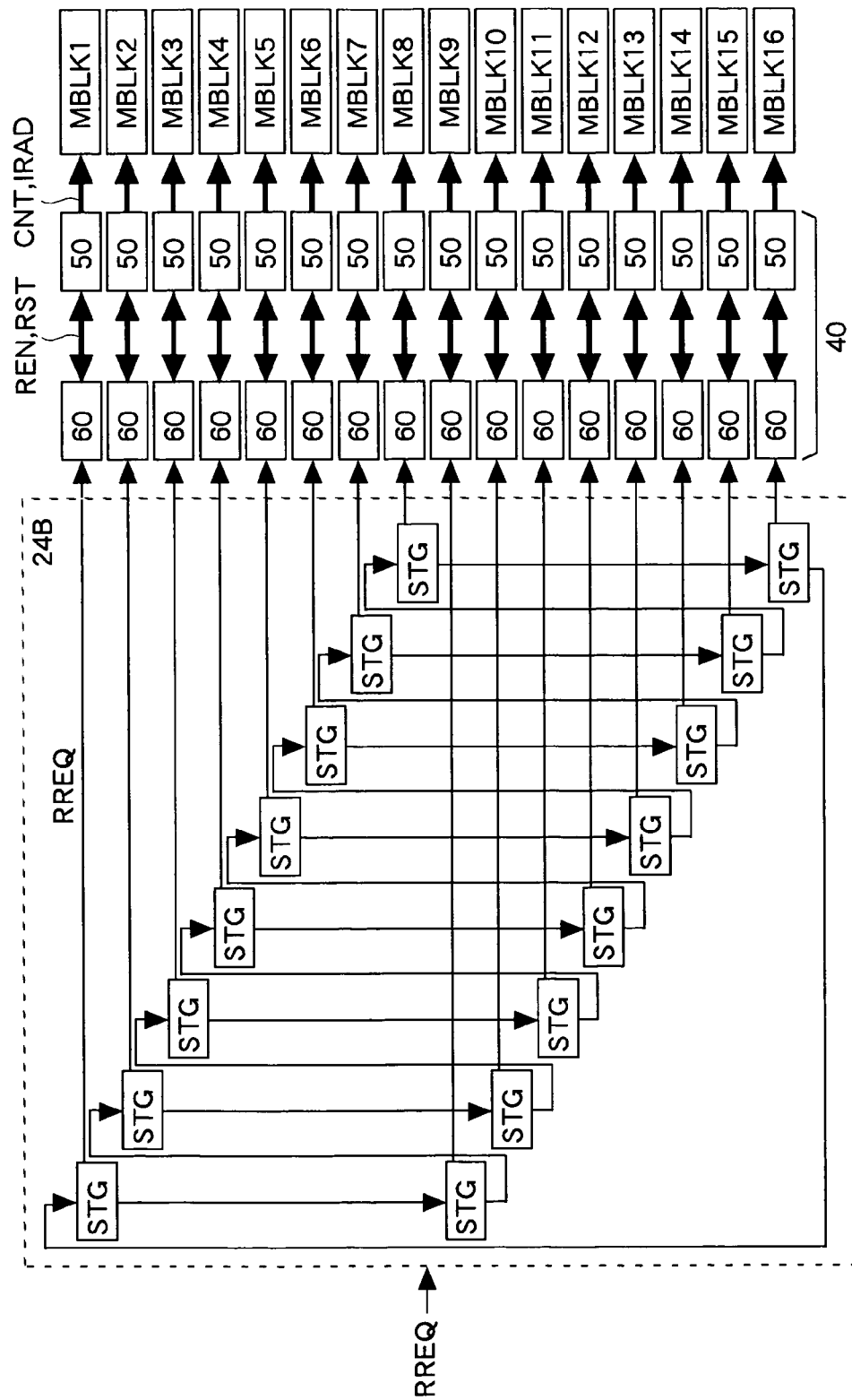
FIG. 8 is a block diagram showing essential parts of a semiconductor memory of a third embodiment in the present invention.

FIG. 8 shows essential parts of a semiconductor memory of a third embodiment in the present invention. The same reference symbols are used to designate the same elements as the elements described in the first embodiment, and detailed description thereof will be omitted. A semiconductor memory MEM of this embodiment has a refresh distribution circuit 24B in place of the refresh distribution circuit 24 of the first embodiment. The other configuration is the same as that of the first embodiment. That is, the semiconductor memory MEM is formed as a pseudo SRAM. Note that the refresh distribution circuit 24B of this embodiment may be applied to the semiconductor memory MEM of the second embodiment.

In the refresh distribution circuit 24B, the connection order of memory stages STG does not correspond to the arrangement order of memory blocks MBLK1-16, but each memory stage STG corresponding to the memory block MBLK is connected to a memory stage STG corresponding to the eighth or ninth memory block MBLK therefrom. That is, in response to a refresh request RREQ, the refresh distribution circuit 24B outputs the refresh request RREQ to every eight or nine operation control units 40 provided in line in the arrangement direction of the memory blocks BLK1-16 (vertical direction in the drawing).

The above-described third embodiment can also provide the same effects as those of the first embodiment previously described. In addition, in this embodiment, owing to the refresh distribution circuit 24B, it is possible to lower the probability that refresh hold circuits 60 adjacent to each other both hold the refresh requests. In other words, the refresh hold circuits 60 holding the refresh requests can be dispersed. In particular, it is possible to lower the probability that the refresh requests are accumulated in the adjacent refresh hold circuits 60, as shown in FIG. 5. As a result, it is possible to prevent the accumulation of the refresh requests in the refresh hold circuits 60, which can lower the possibility that the overlap signal OVLP is outputted. Therefore, the data transfer rate of the memory MEM can be improved, which can improve performance of the system.

Figure 9:
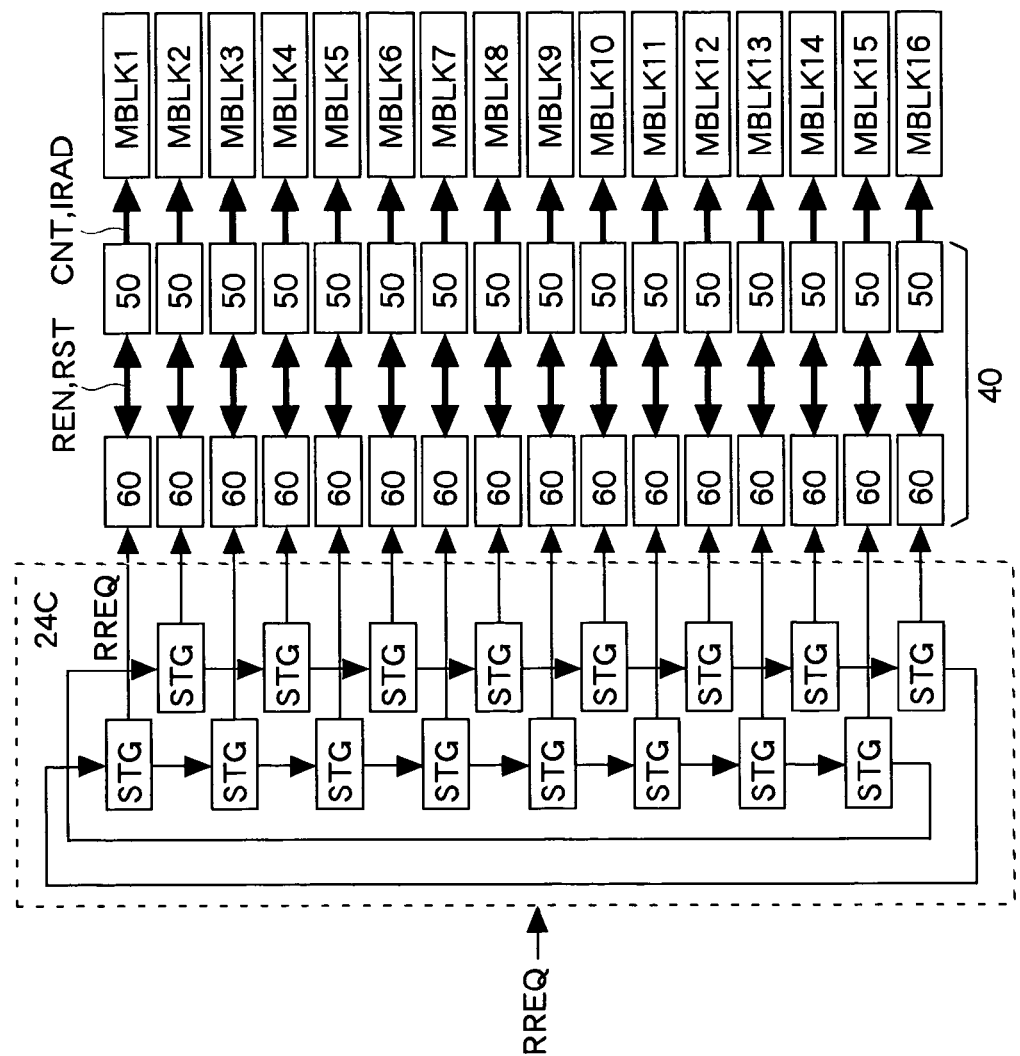
FIG. 9 is a block diagram showing essential parts of a semiconductor memory of a fourth embodiment in the present invention.

FIG. 9 shows essential parts of a semiconductor memory of a fourth embodiment in the present invention. The same reference symbols are used to designate the same elements as the elements described in the first embodiment, and detailed description thereof will be omitted. A semiconductor memory MEM of this embodiment has a refresh distribution circuit 24C in place of the refresh distribution circuit 24 of the first embodiment. The other configuration is the same as that of the first embodiment. That is, the semiconductor memory MEM is formed as a pseudo SRAM. Note that the refresh distribution circuit 24C of this embodiment may be applied to the semiconductor memory MEM of the second embodiment.

In this embodiment, in the refresh distribution circuit 24C, each memory stage STG is connected to a second memory stage STG therefrom. The refresh distribution circuit 24C outputs a refresh request RREQ to every other one of the operation control units 40 arranged in an arrangement direction of memory blocks MBLK1-16 (vertical direction in the drawing), in response to the refresh request RREQ. The above-described fourth embodiment can also provide the same effects as those of the first to third embodiments previously described.

Figure 10:
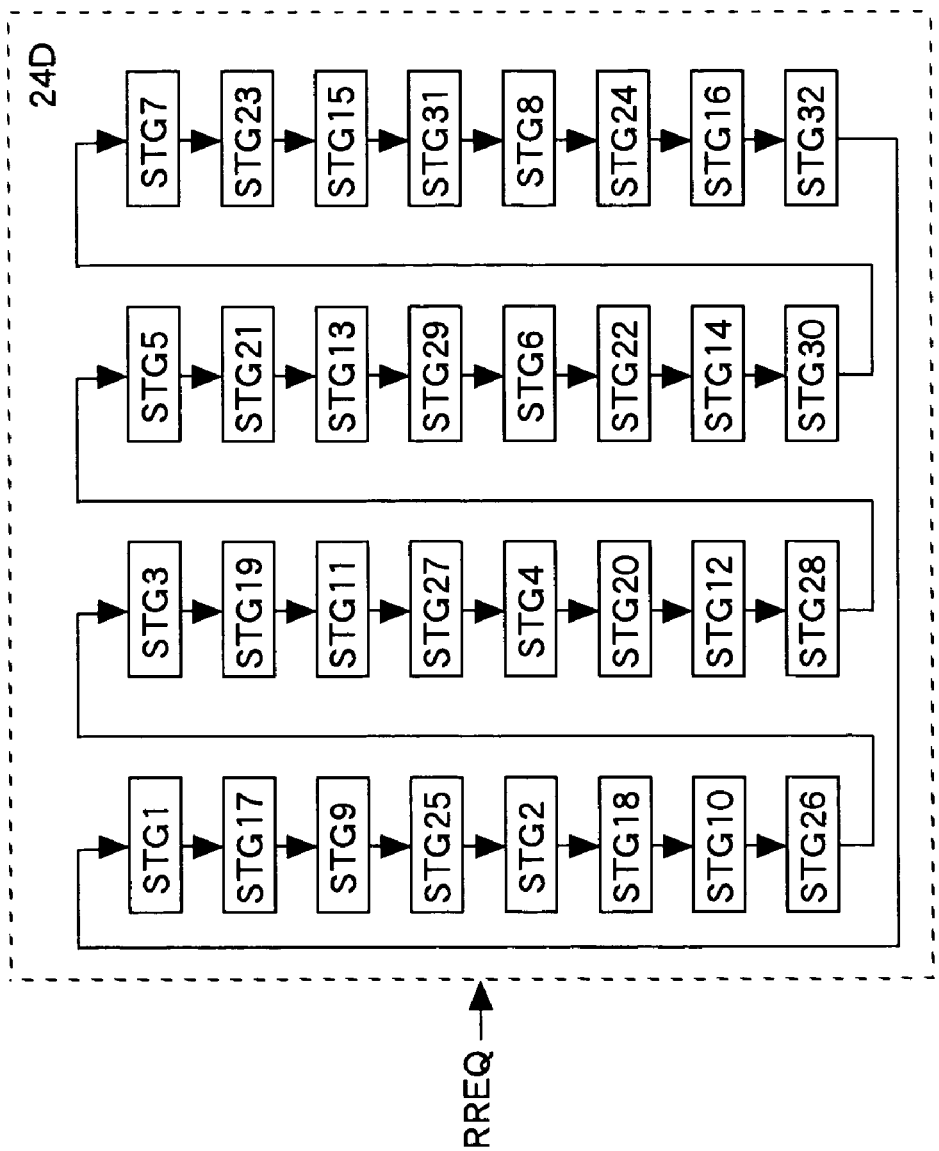
FIG. 10 is a block diagram showing a refresh distribution circuit of a fifth embodiment in the present invention.

FIG. 10 shows a refresh distribution circuit in a semiconductor memory of a fifth embodiment in the present invention. The same reference symbols are used to designate the same elements as the elements described in the first embodiment, and detailed description thereof will be omitted. A semiconductor memory MEM of this embodiment has a refresh distribution circuit 24D in place of the refresh distribution circuit 24 of the first embodiment. The other configuration is the same as that of the first embodiment except that it has 32 memory blocks MBLK and has block control circuits 50 and refresh hold circuits 60 corresponding to these memory blocks MBLK. That is, the semiconductor memory MEM is formed as a pseudo SRAM. Note that the refresh distribution circuit 24D of this embodiment may be applied to the semiconductor memory MEM of the second embodiment.

In the refresh distribution circuit 24D, each memory stage STG is connected to a memory stage STG corresponding to a 16th, 24th, 16th, or 9th memory block MBLK from the memory block MBLK corresponding thereto. Specifically, assuming that block addresses of the not-shown 32 memory blocks MBLK1-32 are expressed as a five-digit binary number "adcde" (in certain values, for example, the addresses of MBLKs 5, 10, 16 are expressed as "00100", "01001", and "01111" respectively), the memory stages STG are connected in ascending order of "cdeba" which is a value resulting from the rearrangement of bits. The fifth embodiment described above can also provide the same effects as those of the first to third embodiments previously described.

Figure 11:
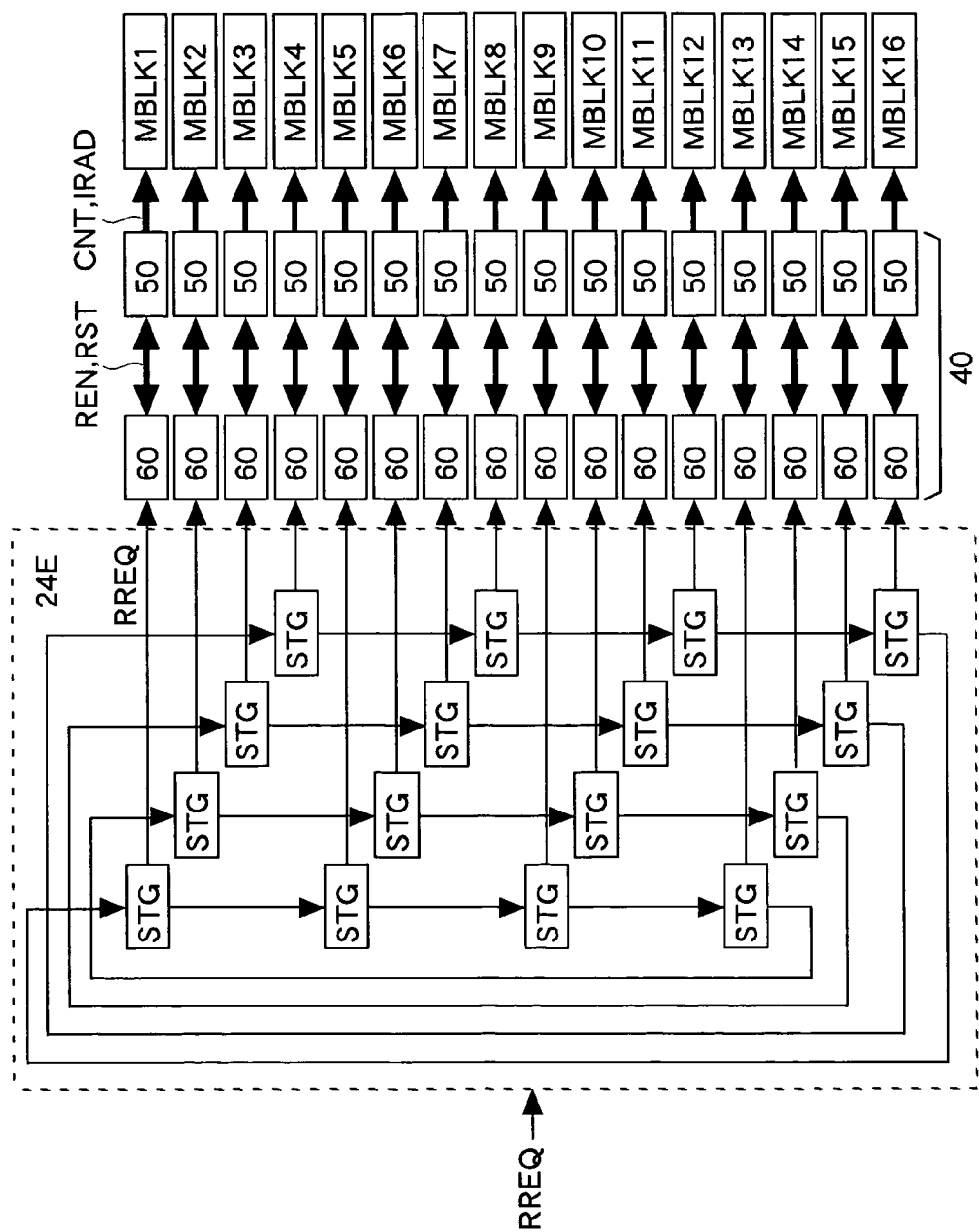
FIG. 11 is a block diagram showing essential parts of a semiconductor memory of a sixth embodiment in the present invention.

FIG. 11 shows essential parts of a semiconductor memory of a sixth embodiment in the present invention. The same reference symbols are used to designate the same elements as the elements described in the first embodiment, and detailed description thereof will be omitted. A semiconductor memory MEM of this embodiment has a refresh distribution circuit 24E in place of the refresh distribution circuit 24 of the first embodiment. The other configuration is the same as that of the first embodiment. Note that the refresh distribution circuit 24E of this embodiment may be applied to the semiconductor memory MEM of the second embodiment.

In this embodiment, in the refresh distribution circuit 24E, each memory stage STG is connected to a fourth memory stage STG therefrom. The sixth embodiment described above can provide the same effects as those of the first to third embodiments previously described.

Figure 12:
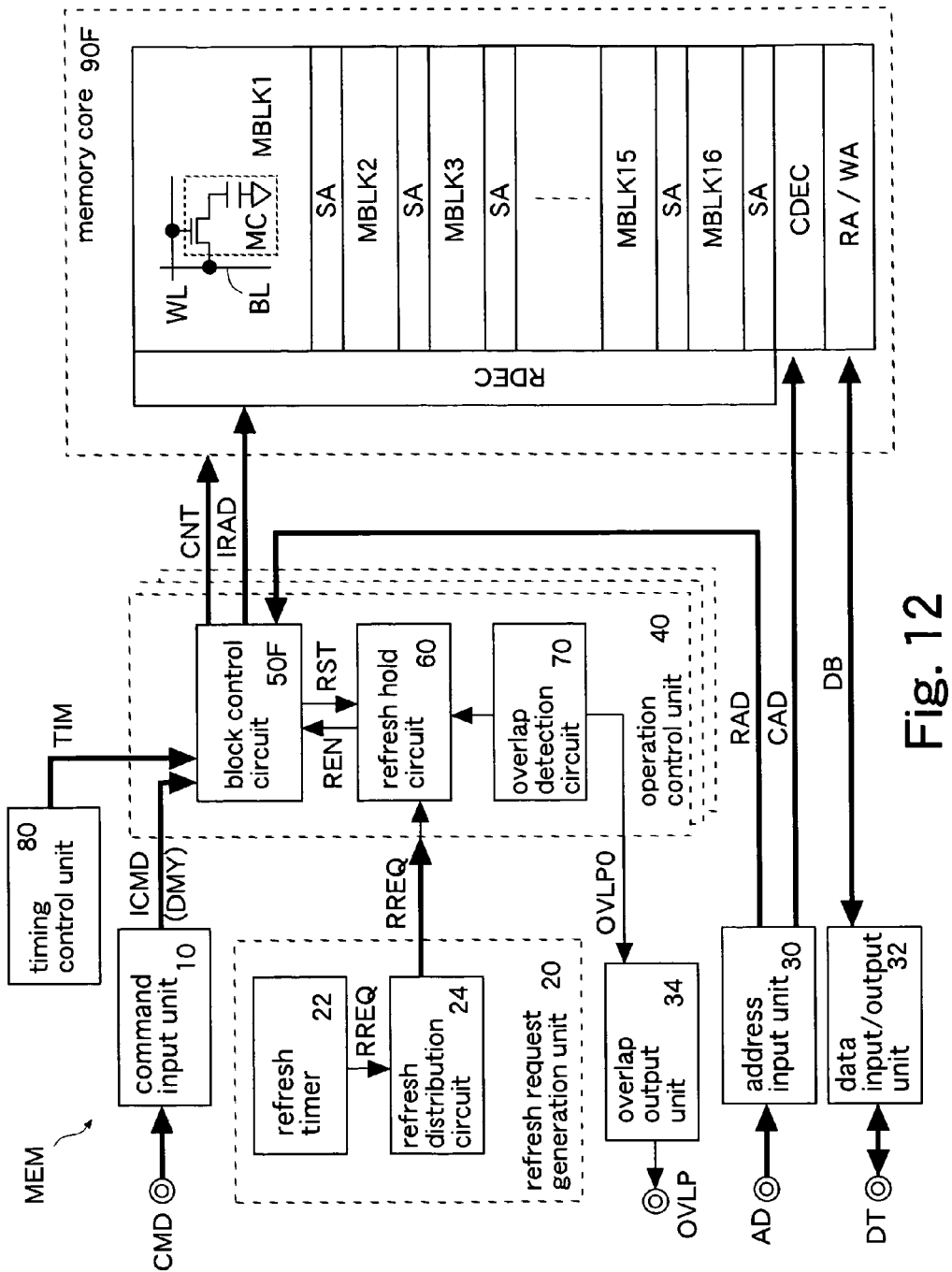
FIG. 12 is a block diagram showing a semiconductor memory of a seventh embodiment in the present invention.

FIG. 12 shows a semiconductor memory of a seventh embodiment in the present invention. The same reference symbols are used to designate the same elements as the elements described in the first embodiment, and detailed description thereof will be omitted. A semiconductor memory MEM of this embodiment has block control circuits 50F and a memory core 90F in place of the block control circuits 50 and the memory core 90 of the first embodiment. The other configuration is the same as that of the first embodiment. That is, the semiconductor memory MEM is formed as a pseudo SRAM. Note that the block control circuits 50F and the memory core 90F of this embodiment may be applied to the semiconductor memory MEM of the second embodiment.

In the memory core 90F of this embodiment, sense amplifiers SA are formed in correspondence with respective memory blocks MBLK1-16. That is, each of the sense amplifiers SA is not shared by the adjacent memory blocks MBLK. Therefore, a refresh control circuit 54 (FIG. 2) of each of the block control circuits 50F can judge that refresh operations for all the memory blocks MBLK except the memory block MBLK for which an access operation is executed are executable. In other words, it is possible to execute the refresh operation for the memory block MBLK adjacent to the memory block MBLK for which the access operation is executed. As a result, the logic of the block control circuits 50F (refresh control circuits 54) can be made simple.

The seventh embodiment described above can also provide the same effects as those of the first and second embodiments previously described. In addition, in this embodiment, the configuration of the circuits controlling the refresh operation can be made simple.

The foregoing embodiments have described the examples where the present invention is applied to the pseudo SRAM. However, the present invention is not limited to such embodiments. For example, the present invention may be applied to a DRAM that is capable of internally generating a refresh request. Alternatively, the present invention may be applied to a semiconductor memory such as a SDRAM having a plurality of banks.

Figure 13:
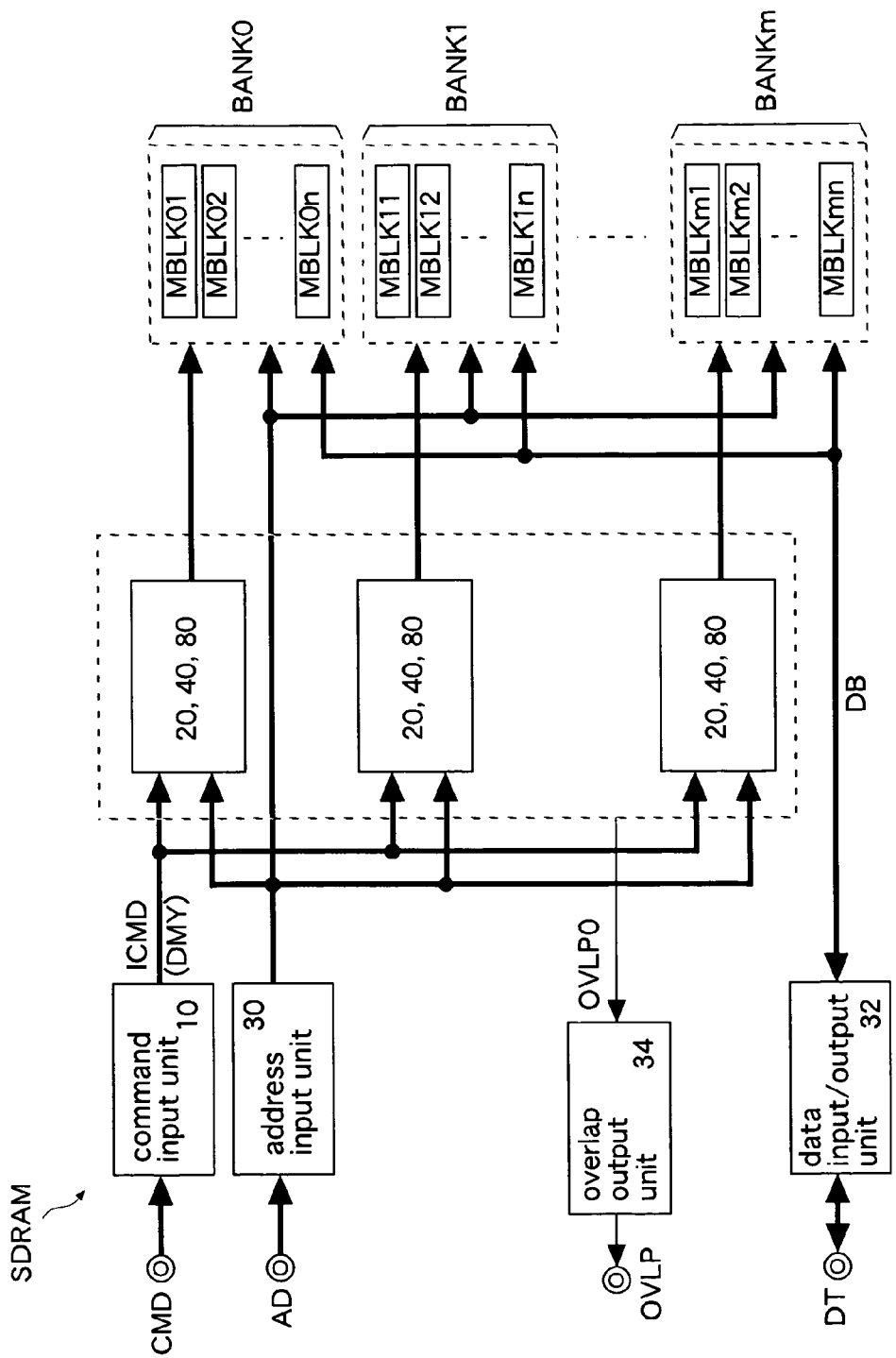
FIG. 13 is a block diagram showing an example of an SDRAM to which the present invention is applied.

FIG. 13 shows an example of a SDRAM to which the present invention is applied. The SDRAM has: a plurality of banks BANK (BANK0, BANK1, . . . , BANKm) that can operate independently; refresh request generation units 20, operation control units 40, and timing control units 80 which correspond to the banks BANK0-*m* respectively; and a command input unit 10, an address input unit 30, an overlap output unit 34, and a data input/output unit 32 which are common to the banks BANK0-*m*. Each of the banks BANK has the same configuration as that of the memory core 90 shown in FIG. 1 and has a plurality of memory blocks MBLK (MBLK01, MBLK02, and so forth).

Figure 14:
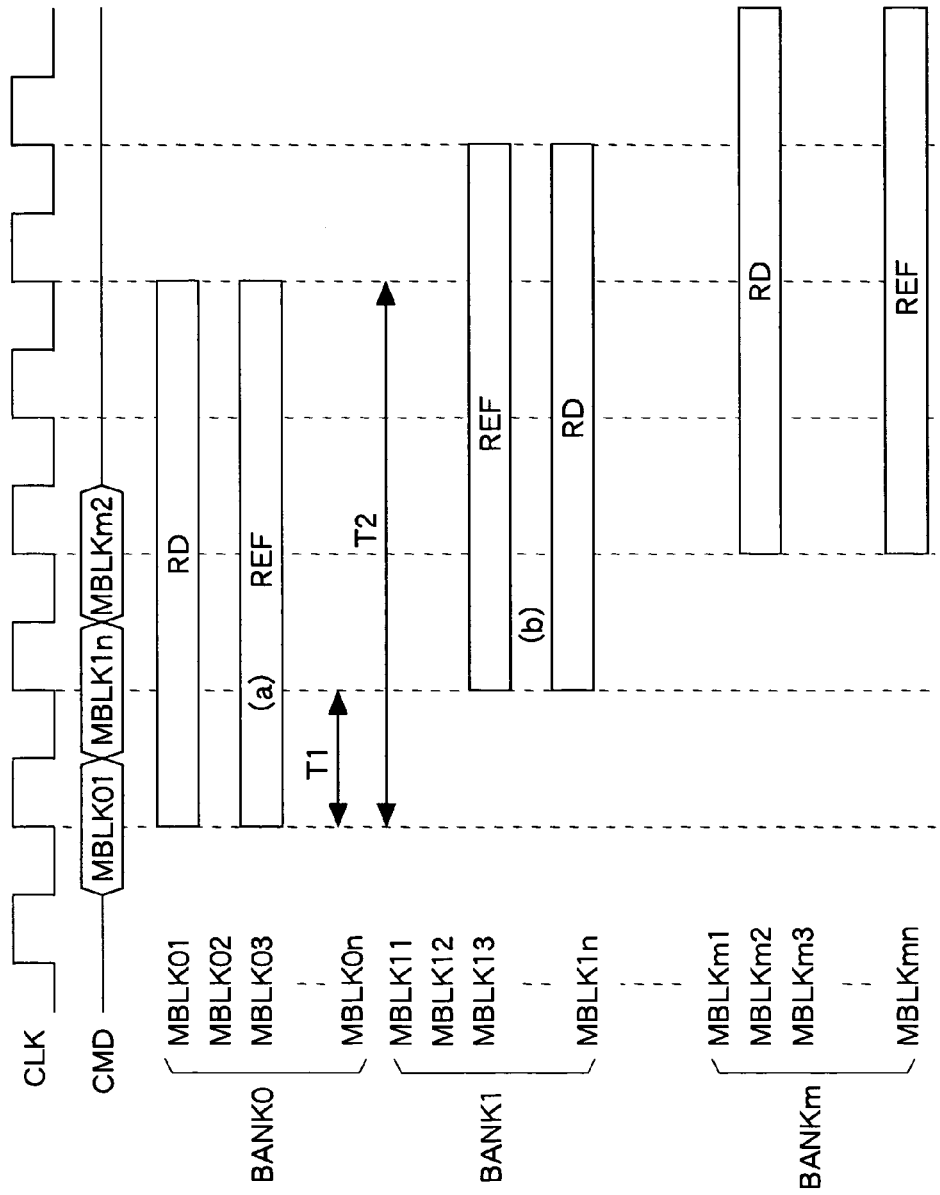
FIG. 14 is a timing diagram of showing an operation of the RAM to which the present invention is applied.

For example, as shown in FIG. 14, when receiving an access command CMD (read access request) for the memory block MBLK01 of the bank BANK0, the SDRAM executes a refresh operation REF of one of the memory blocks MBLK, in the bank BANK0, for which an access operation is not executed, in synchronization with a read operation RD for the memory block MBLK01 (FIG. 14(*a*)). The refresh operation is executed in synchronization with the access operation corresponding to the access command CMD in a case where a refresh request for one of the memory blocks MBLK in the bank BANK0 is held and the access operation and the refresh operation do not conflict with each other. The other banks BANK also execute the access operation RD and the refresh operation REF simultaneously in response to the access request (14(*b*)). The access request may be a write access request for executing a write operation for BANK. Here, the specification of an access cycle time T1 which is a minimum supply interval for the access requests is designed to be shorter than an access operation time T2 taken to execute the access operation for each of the memory blocks MBLK once.

In a conventional SDRAM, a bank cannot execute a refresh operation while executing an access operation. When a refresh request is generated, the refresh operation is executed in a bank for which the access operation is not being executed. Accordingly, the number of the banks capable of executing the access operation is reduced during the execution of the refresh operation corresponding to the refresh request. On the other hand, in the present invention, even during the execution of the refresh operation, the number of the banks capable of executing the access operation is not decreased.

Further, the foregoing embodiments have described the examples where, when the refresh hold circuit 60 holds the refresh request, the access operation is executed for one of the memory blocks MBLK and the refresh operation is executed for one of the other memory blocks MBLK, in response to one access request. However, the present invention is not limited to such embodiments. For example, the refresh operations for two memory blocks MBLK or more may be simultaneously executed. In this case, for example, in the states ST10-3 and ST10-4 shown in FIG. 5, two refresh operations are simultaneously executable. This prevents frequent accumulation of the refresh requests, which can lower the probability that the overlap signal OVLP is outputted. Therefore, it is possible to prevent a decrease of the data transfer rate between the controller and the memory MEM. In a case where the plural refresh operations are simultaneously executed, the start timing of the refresh operation is desirably made slightly different from the start timing of the access operation. This lessens the number of circuits that start their operations simultaneously, which can reduce peak current of the memory MEM.

Figure 15:
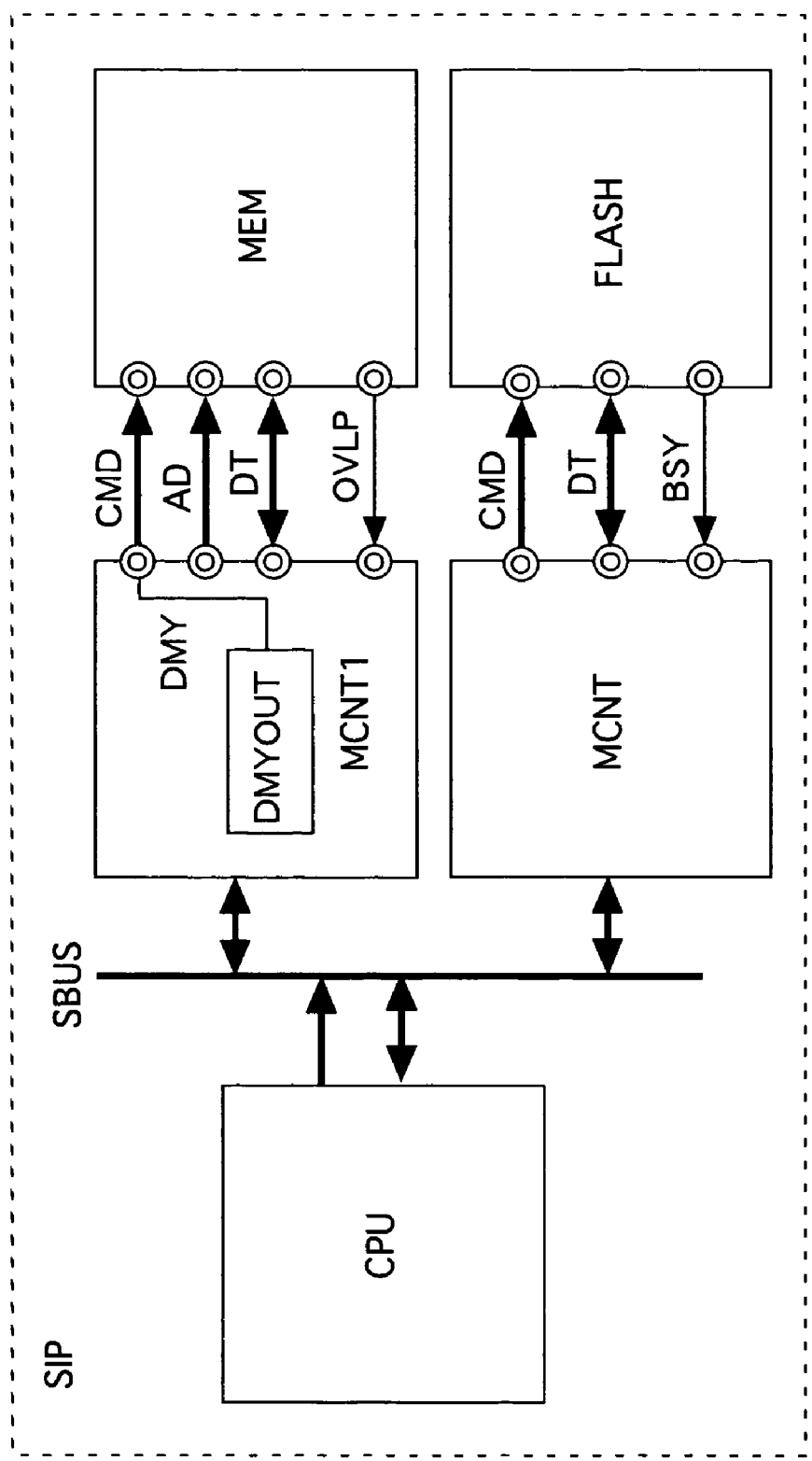
FIG. 15 is a block diagram showing another example of a memory system to which the present invention is applied.

The foregoing embodiments have described the examples where the memory MEM of the present invention is mounted on the memory system shown in FIG. 3. However, the present invention is not limited to such embodiments. For example, the memory MEM of the present invention may be mounted on a memory system shown in FIG. 15. In the memory system in FIG. 15, a memory controller MCNT1 for the memory MEM is arranged between a system bus SBUS and the memory MEM. In this case, when receiving an activated overlap signal OVLP from the memory MEM, the memory controller MCNT1 suspends the supply of an access command CMD to the memory MEM for one access cycle period and outputs a dummy command DMY as the access command CMD.

The aforesaid refresh distribution circuits 24, 24B, 24C, 24D, 24E shown in FIG. 2 and FIG. 8-FIG. 11 are examples for realizing the present invention. The connection specification of the memory stages STG may be different from those described above.

Further, the memory system may be formed as a system LSI (SOC; System On Chip), instead of the SIP, integrated on a silicon substrate, and the memory system may be formed of the CPU, the memory MEM, the flash memory FLASH, and the memory controller MCNT mounted on a printed-wiring board.

The invention is not limited to the above embodiments and various modifications may be made without departing from the spirit and scope of the invention. Any improvement may be made in part or all of the components.

What is claimed is:

1. A semiconductor memory comprising:
a plurality of memory blocks each having memory cells;
a command input unit receiving, from an exterior of the semiconductor memory, an access request for executing an access operation in which data is inputted or outputted to/from one of the memory blocks; and
a memory control unit executing the access operation on one of the memory blocks and a refresh operation on at least one of the memory blocks on which the access operation is not executed, in response to the access request,
wherein the memory control unit includes:
a plurality of operation control units provided in correspondence with the plurality of memory blocks respectively and controlling operations to the memory blocks, wherein each of the plurality of operation control units includes a refresh hold circuit holding a refresh request, and a block control circuit, and
wherein the block control circuit executes a refresh operation on a corresponding memory block when the access request does not address the corresponding memory block and the refresh hold circuit holds the refresh request, and starts executing the refresh operation on the corresponding memory block in a future access cycle in synchronization with an access operation corresponding to an access request in the future access cycle when the access request in the future access cycle does not address the corresponding memory block and the refresh hold circuit holds the refresh request, and
wherein the memory control unit further includes:
a refresh request generation unit, provided in correspondence with the memory blocks respectively, generating the refresh request at a predetermined cycle and sequentially outputting generated refresh requests to one of the operation control units,
wherein the block control circuit provides and executes, in correspondence with each of the plurality of operation control units the access operation on the corresponding memory block when the access request addresses the corresponding memory block, and wherein the semiconductor memory further comprises:
a timing control unit generating a common timing signal for determining a generation timing of access control signals outputted by the block control circuits, wherein said block control circuits simultaneously execute the access operation and the refresh operation on said memory blocks by using the access control signals which are synchronous with the timing signal.

2. A semiconductor memory comprising:
a plurality of memory blocks each having memory cells;
a command input unit receiving, from an exterior of the semiconductor memory, an access request for executing an access operation in which data is inputted or outputted to/from one of the memory blocks; and
a memory control unit executing the access operation on one of the memory blocks and a refresh operation on at least one of the memory blocks on which the access operation is not executed, in response to the access request,
wherein the memory control unit includes:
a plurality of operation control units provided in correspondence with the plurality of memory blocks respectively and controlling operations to the memory blocks, wherein each of the plurality of operation control units includes a refresh hold circuit holding a refresh request, and a block control circuit, and
wherein the block control circuit executes a refresh operation on a corresponding memory block when the access request does not address the corresponding memory block and the refresh hold circuit holds the refresh request, and starts executing the refresh operation on the corresponding memory block in a future access cycle in synchronization with an access operation corresponding to an access request in the future access cycle when the access request in the future access cycle does not address the corresponding memory block and the refresh hold circuit holds the refresh request, and
wherein the memory control unit further includes:
a refresh request generation unit, provided in correspondence with the memory blocks respectively, generating the refresh request at a predetermined cycle and sequentially outputting generated refresh requests to one of the operation control units,
wherein the block control circuit provides and executes, in correspondence with each of the plurality of operation control units the access operation on the corresponding memory block when the access request addresses the corresponding memory block, and wherein the semiconductor memory further comprises:
a sense amplifier arranged between memory blocks adjacent to each other and shared by the adjacent memory blocks; and
refresh reservation circuits which are provided in the block control circuits respectively and which, when the refresh hold circuit corresponding to the memory block adjacent to the memory block on which the access operation is executed holds the refresh request, reserve execution of the refresh operation that is to be executed in response to the holding.

3. A semiconductor memory comprising:

a plurality of memory blocks each having memory cells;

a command input unit receiving, from an exterior of the semiconductor memory, an access request for executing an access operation in which data is inputted or outputted to/from one of the memory blocks; and a memory control unit executing the access operation on one of the memory blocks and a refresh operation on at least one of the memory blocks on which the access operation is not executed, in response to the access request, wherein the memory control unit includes:

a plurality of operation control units provided in correspondence with the plurality of memory blocks respectively and controlling operations to the memory blocks, wherein each of the plurality of operation control units includes a refresh hold circuit holding a refresh request, and a block control circuit, and wherein the block control circuit executes a refresh operation on a corresponding memory block when the access request does not address the corresponding memory block and the refresh hold circuit holds the refresh request, and starts executing the refresh operation on the corresponding memory block in a future access cycle in synchronization with an access operation corresponding to an access request in the future access cycle when the access request in the future access cycle does not address the corresponding memory block and the refresh hold circuit holds the refresh request, and wherein the memory control unit further includes:

a refresh request generation unit, provided in correspondence with the memory blocks respectively, generating the refresh request at a predetermined cycle and sequentially outputting generated refresh requests to one of the operation control units, wherein the block control circuit provides and executes, in correspondence with each of the plurality of operation control units the access operation on the corresponding memory block when the access request addresses the corresponding memory block, and wherein, each block control circuit outputs a reset signal in response to the refresh operation; and each refresh hold circuit cancels the held refresh request in response to the reset signal.

4. A semiconductor memory comprising:

a plurality of memory blocks each having memory cells;

a command input unit receiving, from an exterior of the semiconductor memory, an access request for executing an access operation in which data is inputted or outputted to/from one of the memory blocks; and a memory control unit executing the access operation on one of the memory blocks and a refresh operation on at least one of the memory blocks on which the access operation is not executed, in response to the access request, wherein the memory control unit includes:

a plurality of operation control units provided in correspondence with the plurality of memory blocks respectively and controlling operations to the memory blocks, wherein each of the plurality of operation control units includes a refresh hold circuit holding a refresh request, and a block control circuit, and wherein the block control circuit executes a refresh operation on a corresponding memory block when the access request does not address the corresponding memory block and the refresh hold circuit holds the refresh request, and starts executing the refresh operation on the corresponding memory block in a future access cycle in synchronization with an access operation corresponding to an access request in the future access cycle when the access request in the future access cycle does not address the corresponding memory block and the refresh hold circuit holds the refresh request, and wherein the memory control unit further includes:

a refresh request generation unit, provided in correspondence with the memory blocks respectively, generating the refresh request at a predetermined cycle and sequentially outputting generated refresh requests to one of the operation control units, wherein the block control circuit provides and executes, in correspondence with each of the plurality of operation control units the access operation on the corresponding memory block when the access request addresses the corresponding memory block, and wherein the semiconductor memory further comprises:

refresh order control circuits provided in the block control circuits respectively and determining an order in which the refresh operations are executed when plural ones of the refresh hold circuits hold the refresh requests.

5. The semiconductor memory according to claim 4, wherein the refresh order control circuits determine the order in which the refresh operations are executed, in accordance with an order in which refresh hold circuits corresponding to the plurality of operation control units have held the refresh requests.

6. A semiconductor memory comprising:

a plurality of memory blocks each having memory cells;

a command input unit receiving, from an exterior of the semiconductor memory, an access request for executing an access operation in which data is inputted or outputted to/from one of the memory blocks; and a memory control unit executing the access operation on one of the memory blocks and a refresh operation on at least one of the memory blocks on which the access operation is not executed, in response to the access request, wherein the memory control unit includes:

a plurality of operation control units provided in correspondence with the plurality of memory blocks respectively and controlling operations to the memory blocks, wherein each of the plurality of operation control units includes a refresh hold circuit holding a refresh request, and a block control circuit, and wherein the block control circuit executes a refresh operation on a corresponding memory block when the access request does not address the corresponding memory block and the refresh hold circuit holds the refresh request, and starts executing the refresh operation on the corresponding memory block in a future access cycle in synchronization with an access operation corresponding to an access request in the future access cycle when the access request in the future access cycle does not address the corresponding memory block and the refresh hold circuit holds the refresh request, and wherein the memory control unit further includes:

a refresh request generation unit, provided in correspondence with the memory blocks respectively, generating the refresh request at a predetermined cycle and sequentially outputting generated refresh requests to one of the operation control units, wherein the block control circuit provides and executes, in correspondence with each of the plurality of operation control units the access operation on the corresponding memory block when the access request addresses the corresponding memory block, and wherein said refresh request generation unit comprises:

a refresh timer generating a trigger signal at a predetermined cycle; and a refresh distribution circuit sequentially outputting the refresh requests to one of the operation control units in response to the trigger signal.

7. The semiconductor memory according to claim 6, wherein the operation control units are arranged in an arrangement direction of the memory blocks; and the refresh distribution circuit sequentially outputs the refresh requests according to an arrangement order of the operation control units in the arrangement direction.

8. The semiconductor memory according to claim 6, wherein the operation control units are arranged in an arrangement direction of the memory blocks; and the refresh distribution circuit outputs the refresh requests to the operation control units arranged in the arrangement direction while at least skipping one in every two operation control units.

9. The semiconductor memory according to claim 6, wherein the refresh distribution circuit is a shift register that has a plurality of memory stages connected in series such that an output of a final memory stage is connected to an input of an initial memory stage, and storing logic therein such that at least one of the memory stages stores different logic from those of the other memory stages, and that outputs the refresh request from the memory stage storing the different logic and performs a shift operation in response to the trigger signal.

10. The semiconductor memory according to claim 1, wherein each of the operation control units comprises a refresh address counter generating a refresh address indicating a memory cell on which the refresh operation is to be executed.

11. A semiconductor memory comprising:

a plurality of memory blocks each having memory cells;

a command input unit receiving, from an exterior of the semiconductor memory, an access request for executing an access operation in which data is inputted or outputted to/from one of the memory blocks; and a memory control unit executing the access operation on one of the memory blocks and a refresh operation on at least one of the memory blocks on which the access operation is not executed, in response to the access request, wherein the memory control unit includes:

a plurality of operation control units provided in correspondence with the plurality of memory blocks respectively and controlling operations to the memory blocks, wherein each of the plurality of operation control units includes a refresh hold circuit holding a refresh request, and a block control circuit, and wherein the block control circuit executes a refresh operation on a corresponding memory block when the access request does not address the corresponding memory block and the refresh hold circuit holds the refresh request, and starts executing the refresh operation on the corresponding memory block in a future access cycle in synchronization with an access operation corresponding to an access request in the future access cycle when the access request in the future access cycle does not address the corresponding memory block and the refresh hold circuit holds the refresh request, and wherein the memory control unit further includes:

a refresh request generation unit, provided in correspondence with the memory blocks respectively, generating the refresh request at a predetermined cycle and sequentially outputting generated refresh requests to one of the operation control units, wherein the block control circuit provides and executes, in correspondence with each of the plurality of operation control units the access operation on the corresponding memory block when the access request addresses the corresponding memory block, and wherein the semiconductor memory further comprises:

overlap detection circuits provided in the operation control units respectively and each outputting an overlap signal when detecting that a new refresh request is supplied to the refresh hold circuit holding the refresh request; and an overlap output unit outputting an external overlap signal to an exterior of the semiconductor memory in response to the output of the overlap signal, wherein:

the command input unit accepts a dummy access request during a period in which the external overlap signal is outputted;

the block control circuit corresponding to the refresh hold circuit overlappingly holding the refresh requests executes the refresh operation in response to the dummy access request; and the other block control circuits neglect the dummy access request.

12. A semiconductor memory comprising:

a plurality of memory blocks each having memory cells;

a command input unit receiving, from an exterior of the semiconductor memory, an access request for executing an access operation in which data is inputted or outputted to/from one of the memory blocks; and a memory control unit executing the access operation on one of the memory blocks and a refresh operation on at least one of the memory blocks on which the access operation is not executed, in response to the access request, wherein the memory control unit includes:

a plurality of operation control units provided in correspondence with the plurality of memory blocks respectively and controlling operations to the memory blocks, wherein each of the plurality of operation control units includes a refresh hold circuit holding a refresh request, and a block control circuit, and wherein the block control circuit executes a refresh operation on a corresponding memory block when the access request does not address the corresponding memory block and the refresh hold circuit holds the refresh request, and starts executing the refresh operation on the corresponding memory block in a future access cycle in synchronization with an access operation corresponding to an access request in the future access cycle when the access request in the future access cycle does not address the corresponding memory block and the refresh hold circuit holds the refresh request, and wherein the memory control unit further includes:

a refresh request generation unit, provided in correspondence with the memory blocks respectively, generating the refresh request at a predetermined cycle and sequentially outputting generated refresh requests to one of the operation control units, wherein the block control circuit provides and executes, in correspondence with each of the plurality of operation control units the access operation on the corresponding memory block when the access request addresses the corresponding memory block, and wherein the semiconductor memory further comprises:

overlap detection circuits provided in the operation control units respectively and each outputting an overlap signal when detecting that a new refresh request is supplied to the refresh hold circuit holding the refresh request;

an overlap output unit outputting an external overlap signal to an exterior of the semiconductor memory in response to the output of the overlap signal; and a dummy access generation unit generating a dummy access request while the external overlap signal is outputted, wherein the block control circuit corresponding to the refresh hold circuit overlappingly holding the refresh requests executes the refresh operation in response to the dummy access request; and the other block control circuits neglect the dummy access request.

13. A semiconductor memory comprising:

a plurality of memory blocks each having memory cells;

a command input unit receiving, from an exterior of the semiconductor memory, an access request for executing an access operation in which data is inputted or outputted to/from one of the memory blocks; and a memory control unit executing the access operation on one of the memory blocks and a refresh operation on at least one of the memory blocks on which the access operation is not executed, in response to the access request, wherein the memory control unit includes:

a plurality of operation control units provided in correspondence with the plurality of memory blocks respectively and controlling operations to the memory blocks, wherein each of the plurality of operation control units includes a refresh hold circuit holding a refresh request, and a block control circuit, wherein the block control circuit executes a refresh operation on a corresponding memory block when the access request does not address the corresponding memory block and the refresh hold circuit holds the refresh request, and starts executing the refresh operation on the corresponding memory block in a future access cycle in synchronization with an access operation corresponding to an access request in the future access cycle when the access request in the future access cycle does not address the corresponding memory block and the refresh hold circuit holds the refresh request, wherein a specification of an access cycle time as a minimum interval at which the access requests are supplied to the semiconductor memory is shorter than a sum of an access operation time and a refresh operation time, the access operation time being a time taken for each of the memory blocks to execute the access operation once, and the refresh operation time being a time taken for each of the memory blocks to execute the refresh operation once.

14. The semiconductor memory according to claim 1, wherein the memory control unit executes the refresh operation once on one of the memory blocks in response to a single access request for executing an access operation.

15. The semiconductor memory according to claim 1, wherein the memory control unit executes the refresh operations on plural ones of the memory blocks in response to a single access request.

16. A memory system comprising a semiconductor memory and a controller accessing the semiconductor memory, wherein the semiconductor memory comprises:

a plurality of memory blocks each having memory cells;

a command input unit receiving an access request and a dummy access request from the controller;

a plurality of operation control units provided in correspondence with the memory blocks respectively, and each having a refresh hold circuit holding a refresh request; and a block control circuit that, when the refresh hold circuit corresponding to the memory block on which an access operation is not executed holds the refresh request, executes the access operation on the memory block and the refresh operation on the memory block corresponding to the refresh hold circuit holding the refresh request, in response to the access request;

a refresh request generation unit generating the refresh request at a predetermined cycle and sequentially outputting generated refresh requests to one of the refresh hold circuits; and an overlap output unit outputting an external overlap signal to the controller when the refresh hold circuit holding the refresh request receives a new refresh request, and wherein:

the controller comprises a dummy request output circuit outputting the dummy access request to the semiconductor memory in response to the external overlap signal;

the block control circuit corresponding to the refresh hold circuit overlappingly holding the refresh requests executes the refresh operation in response to the dummy access request; and the other block control circuits neglect the dummy access request.

17. An operation method of a semiconductor memory including a plurality of memory blocks each having memory cells, a refresh hold circuit provided in correspondence with each of the memory blocks and holding a refresh request of corresponding memory block, and a sense amplifier arranged between memory blocks adjacent to each other and shared by the adjacent memory blocks, comprising:

receiving, from an exterior of the semiconductor memory, an access request for executing an access operation in which data is inputted or outputted to/from one of the plurality of memory blocks;

generating the refresh request at a predetermined cycle;

executing the access operation on the memory block when the access request addresses the corresponding memory block;

holding generated refresh requests in the refresh hold circuit executing the refresh operation on the corresponding memory block when the access request does not address the corresponding memory block and the refresh hold circuit holds the refresh request;

starting executing the refresh operation on the corresponding memory block in a future access cycle in synchronization with an access operation corresponding to an access request in the future access cycle when the access request in the future access cycle does not address the corresponding memory block and the refresh hold circuit holds the refresh request; and when the refresh hold circuit corresponding to the memory block adjacent to the memory block on which the access operation is executed holds the refresh request, reserving execution of the refresh operation that is to be executed in response to the holding.

18. The semiconductor memory according to claim 1, the block control circuit starts executing the refresh operation on the corresponding memory block in the future access cycle when the access request in the future access cycle does not address a memory block adjacent to the corresponding memory block.

19. The operation method of the semiconductor memory according to claim 17, wherein the refresh operation on the corresponding memory block in a future access cycle is stated executing when the access request in the future access cycle does not address a memory block adjacent to the corresponding memory block.

* * * * *